US012484178B2

(12) United States Patent
Liao et al.

(10) Patent No.: US 12,484,178 B2
(45) Date of Patent: Nov. 25, 2025

(54) CIRCUIT BOARD

(71) Applicant: ASUSTeK COMPUTER INC., Taipei (TW)

(72) Inventors: Wei-Chia Liao, Taipei (TW); Wen-Ting Yu, Taipei (TW); Chin-Chuan Wu, Taipei (TW); Yi-Min Hsu, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 304 days.

(21) Appl. No.: 18/317,936

(22) Filed: May 16, 2023

(65) Prior Publication Data

US 2024/0314960 A1   Sep. 19, 2024

(30) Foreign Application Priority Data

Mar. 17, 2023   (TW) ................................ 112109975

(51) Int. Cl.
*H05K 7/14*    (2006.01)
*H05K 1/14*    (2006.01)
*H05K 5/02*    (2006.01)

(52) U.S. Cl.
CPC .......... *H05K 7/1429* (2013.01); *H05K 1/141* (2013.01); *H05K 5/0295* (2013.01)

(58) Field of Classification Search
CPC ......... H01R 13/62–635; H05K 7/1429; H05K 1/141; H05K 5/0295
USPC ....... 710/301, 306, 313, 107, 305, 104, 315; 361/801, 759, 796, 679.4, 679; 439/377, 439/61, 65, 660, 62; 711/103, 12.055, 711/12.081
See application file for complete search history.

(56) References Cited

U.S. PATENT DOCUMENTS

| | | | |
|---|---|---|---|
| 8,360,485 B2* | 1/2013 | Ma ....................... | H05K 5/0221 429/97 |
| 8,636,528 B2* | 1/2014 | Sass ................... | H01R 12/7029 439/372 |
| 9,876,314 B1* | 1/2018 | Cai .................. | H01R 13/62938 |

(Continued)

FOREIGN PATENT DOCUMENTS

| CN | 201601273 U | * 10/2010 |
|---|---|---|
| CN | 216565871 | 5/2022 |
| CN | 115454910 | 12/2022 |

*Primary Examiner* — Anthony Q Edwards
*Assistant Examiner* — Ross Terry Mularski
(74) *Attorney, Agent, or Firm* — JCIPRNET

(57) ABSTRACT

A circuit board is adapted for inserting an expansion card with an electrical contact part, a non-electrical convex part, and a positioning part. The circuit board includes a board body, a slot, a release structure, and a transmission mechanism. The slot is disposed on the board body and includes a socket, a connecting end, and an outer surface. The socket is adapted for the electrical contact part to be inserted. The release structure is movably disposed at the connecting end and includes a limiting part. The transmission mechanism is disposed in the socket, adjacent to the connecting end, or adjacent to the outer surface. The transmission mechanism includes a driving member and a linking member. The driving member is adapted for contacting the electrical contact part, the non-electrical convex part, or the positioning part. The linking member is disposed between the driving member and the release structure.

16 Claims, 29 Drawing Sheets

(56) References Cited

U.S. PATENT DOCUMENTS

| | | | |
|---|---|---|---|
| 10,950,958 B2* | 3/2021 | Geng | H05K 1/141 |
| 2011/0159718 A1* | 6/2011 | Mckee | H01R 13/64 |
| | | | 439/326 |

* cited by examiner

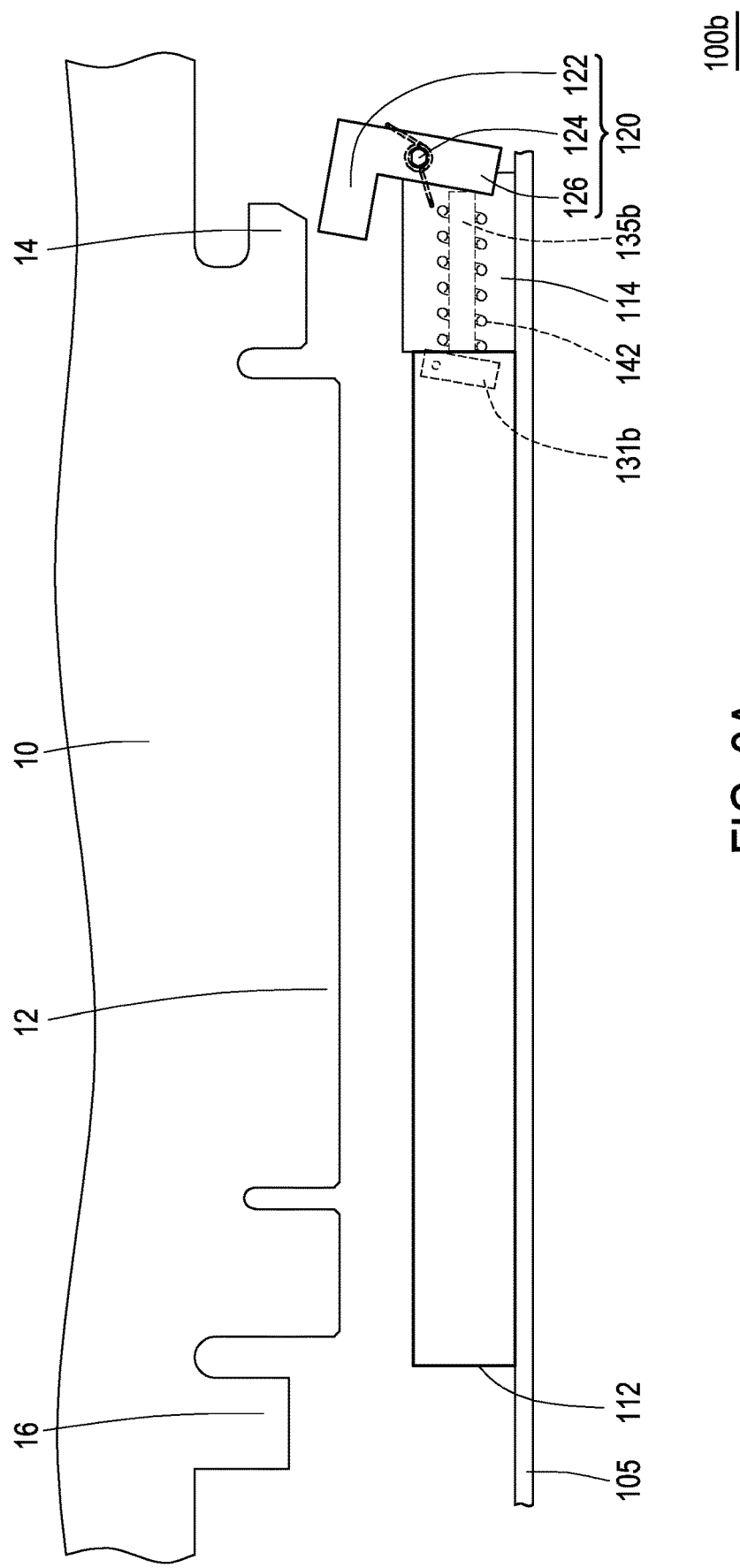

CIRCUIT BOARD

CROSS-REFERENCE TO RELATED APPLICATION

This application claims the priority benefit of Taiwan application serial no. 112109975, filed on Mar. 17, 2023. The entirety of the above-mentioned patent application is hereby incorporated by reference herein and made a part of this specification.

BACKGROUND

Technical Field

The disclosure relates to a circuit board, and in particular to a circuit board adapted for inserting an expansion card.

Description of Related Art

At present, when a graphics card is inserted into a slot on a motherboard, an engaging structure (commonly known as a whale tail) next to the slot may buckle the graphics card, so that the graphics card may be stably inserted and not easily pulled out. To release the graphics card, a user needs to press a locking structure next to the slot or other linking structures to rotate the locking structure to release the graphics card, but the volume of the graphics card is too large, which will prevent the user from pressing the position of the snap-in structure causes confusion for the user.

SUMMARY

A circuit board of the disclosure is adapted for inserting an expansion card. The expansion card includes an electrical contact part, a non-electrical convex part, and a positioning part. The circuit board includes a board body, a slot, a release structure, and a transmission mechanism. The slot is disposed on the board body. The slot includes a socket, a connecting end, and an outer surface. The socket is adapted for the electrical contact part to be inserted. The connecting end is adjacent to the socket. The outer surface is adjacent to the socket and away from the connecting end. The release structure is movably disposed at the connecting end and includes a limiting part. The transmission mechanism is disposed in the socket, adjacent to the connecting end, or adjacent to the outer surface. The transmission mechanism includes a driving member and a linking member. The driving member is adapted for contacting the electrical contact part, the non-electrical convex part, or the positioning part. The linking member is disposed between the driving member and the release structure, the driving member is linked to the linking member, and the linking member is linked to the release structure. When the electrical contact part is inserted into the socket, the electrical contact part, the non-electrical convex part, or the positioning part presses the driving member, the driving member drives the linking member to move, thereby driving the release structure to move, so that the limiting part is limiting to the positioning part.

Based on the above, in the circuit board of the disclosure, when the electrical contact part of the expansion card is inserted into the socket on the slot, the electrical contact part, the non-electrical convex part, or the positioning part presses the driving member, and the driving member drives the linking member to move, and then drives the release structure to move, so that the limiting part is limiting to the positioning part, thereby providing various actuation methods for the release structure.

BRIEF DESCRIPTION OF THE DRAWINGS

FIG. 3A to FIG. 3B are schematic views of a process of inserting an expansion card into a circuit board according to another embodiment of the disclosure.

DESCRIPTION OF THE EMBODIMENTS

Figure 1A:
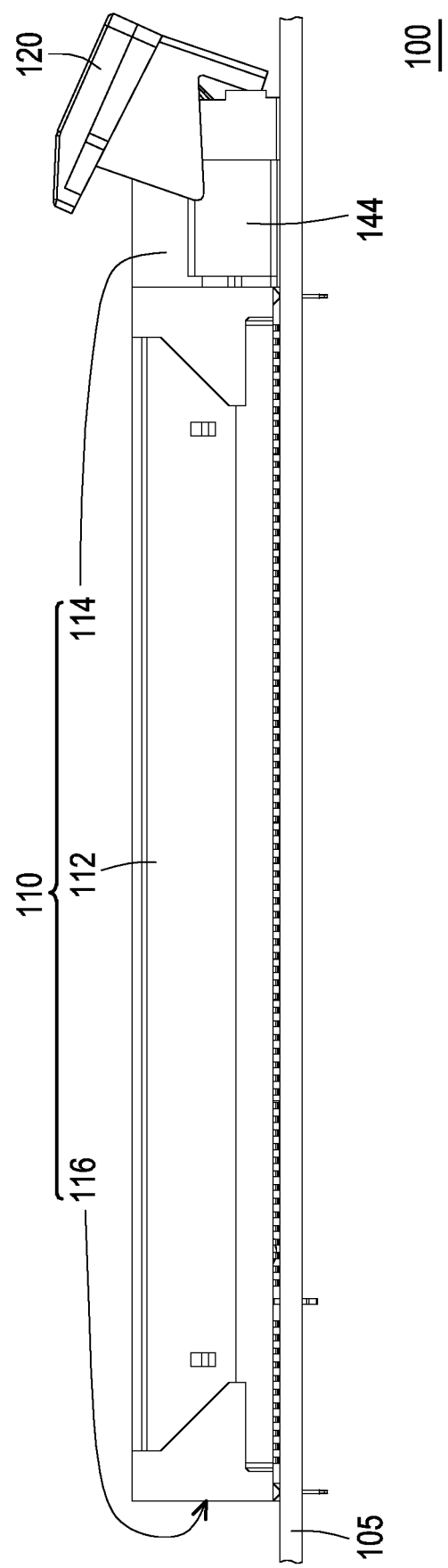
FIG. 1A is a schematic view of an appearance of a circuit board according to an embodiment of the disclosure.
Figure 1B:
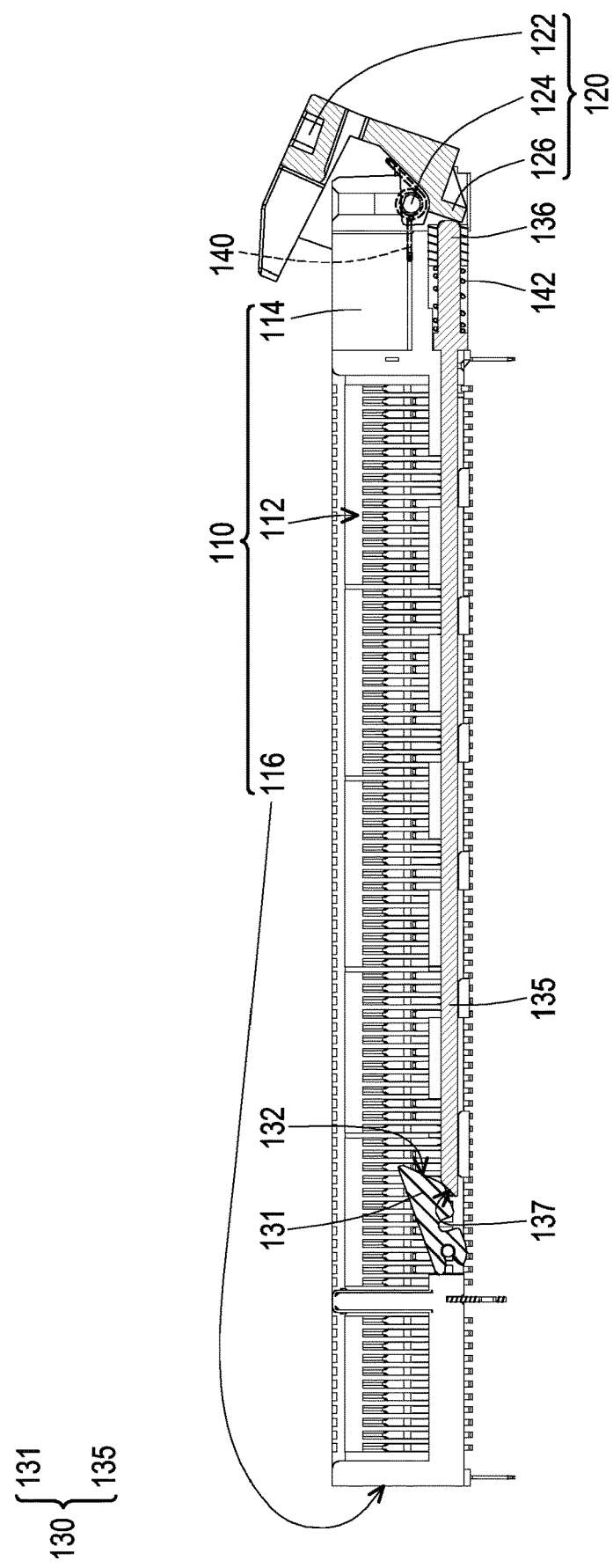
FIG. 1B is a schematic cross-sectional view of FIG. 1A.
Figure 1C:
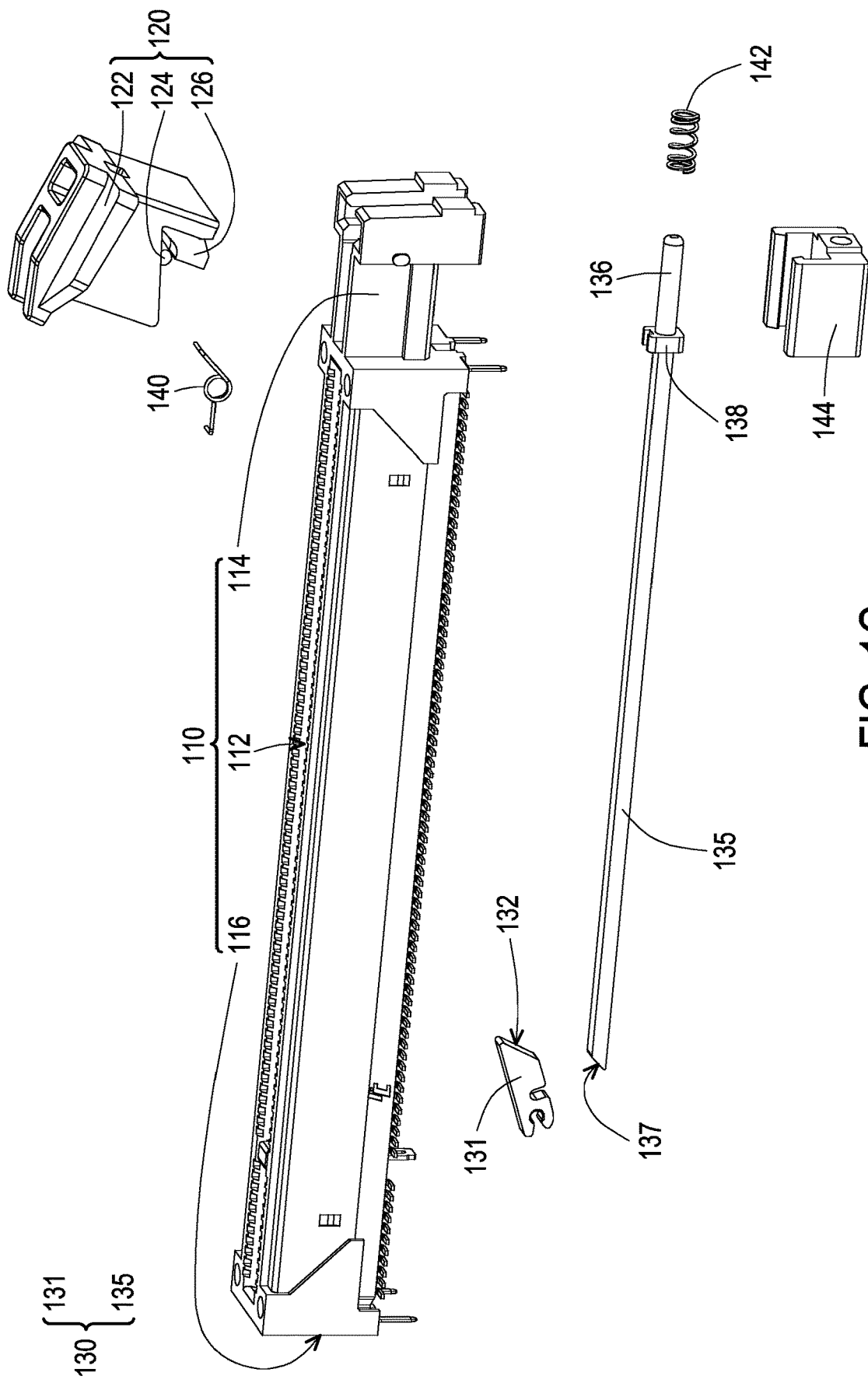
FIG. 1C is an exploded schematic view of FIG. 1A.
Figure 1D:
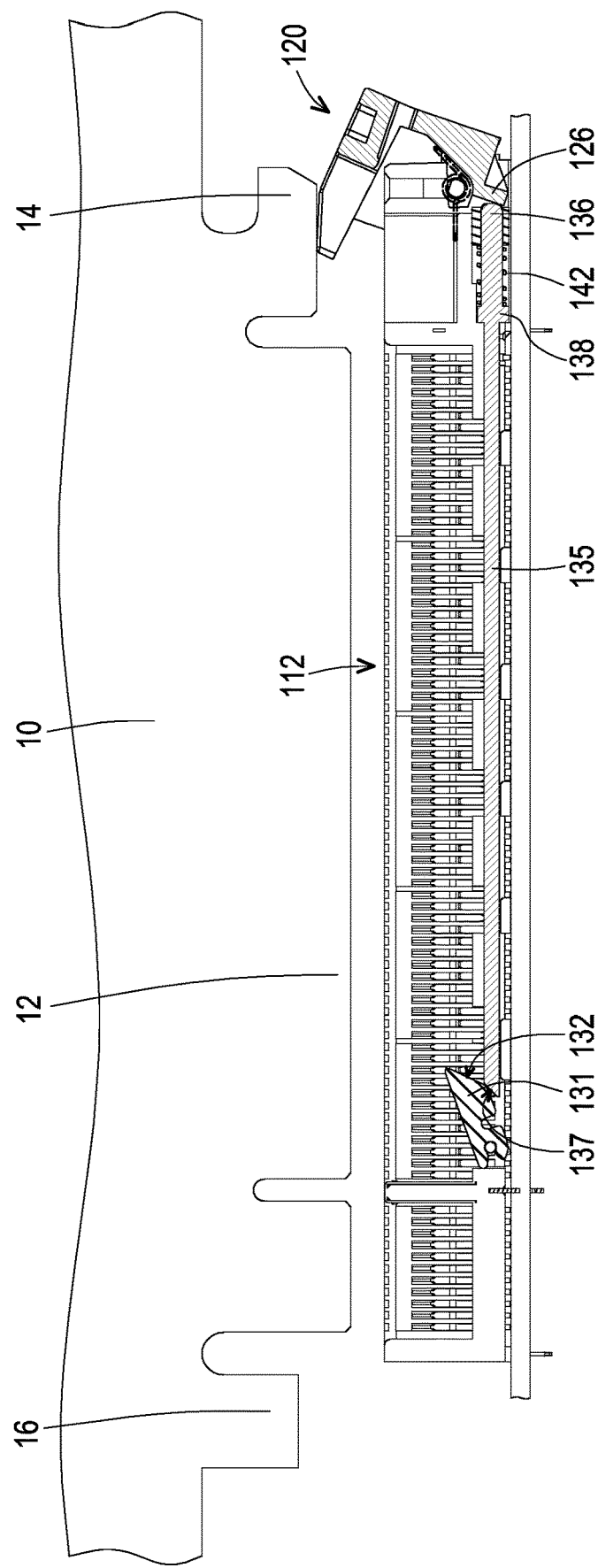
FIG. 1D to FIG. 1E are schematic views of a process of installing an expansion card to the circuit board in FIG. 1A.
Figure 1E:
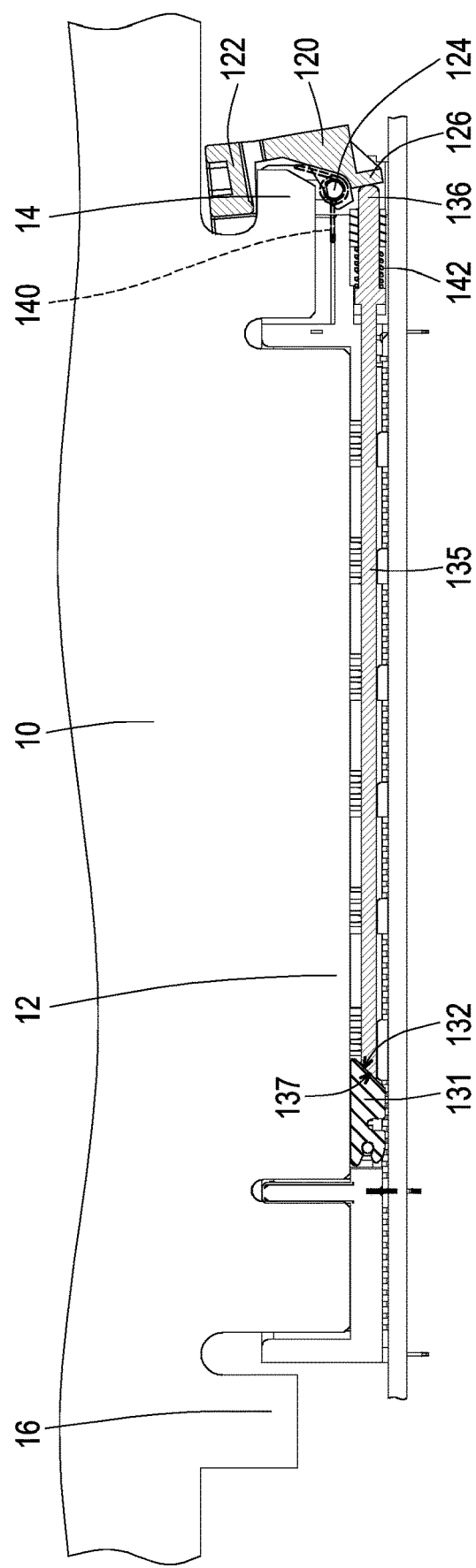

FIG. 1A is a schematic view of an appearance of a circuit board according to an embodiment of the disclosure. FIG. 1B is a schematic cross-sectional view of FIG. 1A. FIG. 1C is an exploded schematic view of FIG. 1A. FIG. 1D to FIG. 1E are schematic views of a process of installing an expansion card to the circuit board in FIG. 1A.

Referring to FIG. 1A to FIG. 1E, a circuit board 100 of this embodiment is adapted for inserting an expansion card 10 (FIG. 1D). As shown in FIG. 1D, the expansion card 10 is, for example, a display card, but the type of the expansion card 10 is not limited thereto. The expansion card 10 includes an electrical contact part 12, a non-electrical convex part 16, and a positioning part 14, and the electrical contact part 12 is disposed between the non-electrical convex part 16 and the positioning part 14.

As shown in FIG. 1B, the circuit board 100 includes a board body 105 (FIG. 1A), a slot 110, a release structure 120, and a transmission mechanism 130. The slot 110 is disposed on the board body 105. The slot 110 includes a socket 112, a connecting end 114, and an outer surface 116. The socket 112 is adapted for the electrical contact part 12 of the expansion card 10 to be inserted. The connecting end 114 is adjacent to the socket 112. The outer surface 116 is adjacent to the socket 112 and away from the connecting end 114.

The release structure 120 is movably disposed at the connecting end 114 and includes a limiting part 122. In this embodiment, the release structure 120 further includes a pivot 124 and a first pushing part 126, the pivot 124 is disposed between the first pushing part 126 and the limiting part 122, and the pivot 124 is pivotally connected to the connecting end 114.

In this embodiment, the transmission mechanism 130 is disposed in the socket 112 and the connecting end 114. The transmission mechanism 130 includes a driving member 131 and a linking member 135. The driving member 131 is adapted for contacting the electrical contact part 12 of the expansion card 10. The linking member 135 is disposed between the driving member and the release structure 120. The driving member 131 is linked to the linking member 135.

In this embodiment, the driving member 131 includes a first bevel 132, and the linking member 135 includes a second bevel 137 abutting the first bevel 132. In addition, the linking member 135 is linked to the release structure 120. In this embodiment, the linking member 135 includes a second pushing part 136 abutting the first pushing part 126.

In addition, in this embodiment, the circuit board 100 further includes a first elastic member 140 disposed between the connecting end 114 and the release structure 120. The first elastic member 140 is, for example, a torsion spring, which is sleeved on the pivot 124. An end of the first elastic member 140 abuts the release structure 120, and another end abuts the connecting end 114, so that the release structure 120 shows a state of being turned inside out as in FIG. 1B in a normal condition.

In this embodiment, the circuit board 100 further includes a second elastic member 142 sleeved on the linking member 135 and disposed between the release structure 120 and the driving member 131. The second elastic member 142 is, for example, a spring. The linking member 135 includes a cam 138 (FIG. 1C). An end of the second elastic member 142 abuts the cam 138, and another end abuts the connecting end 114.

The circuit board 100 further includes a fixing base 144 disposed between the connecting end 114 and the board body 105 (FIG. 1A) for positioning the second elastic member 142. The second elastic member 142 is disposed between the connecting end 114 and the fixing base 144.

As shown in FIG. 1D and FIG. 1A, in this embodiment, the driving member 131 is disposed in the socket 112, so that the driving member 131 is hidden by the slot 110 in appearance. The driving member 131 is adapted for being pressed down by the electrical contact part 12 of the expansion card 10 to move.

As shown in FIG. 1D to FIG. 1E, in this embodiment, when the electrical contact part 12 of the expansion card 10 is inserted into the socket 112, the electrical contact part 12 presses the driving member 131, and the driving member 131 is pressed down. The first bevel 132 of the driving member 131 pushes the second bevel 137 of the linking member 135, and drives the linking member 135 to move toward the release structure 120, so that the second pushing part 136 of the linking member 135 pushes the first pushing part 126 of the release structure 120, the release structure 120 rotates correspondingly about the pivot 124 as an axis, as shown in FIG. 1E, and the limiting part 122 of the release structure 120 is limiting to the positioning part 14 of the expansion card 10. At this time, the first elastic member 140 and the second elastic member 142 accumulate an elastic force.

Figure 1F:
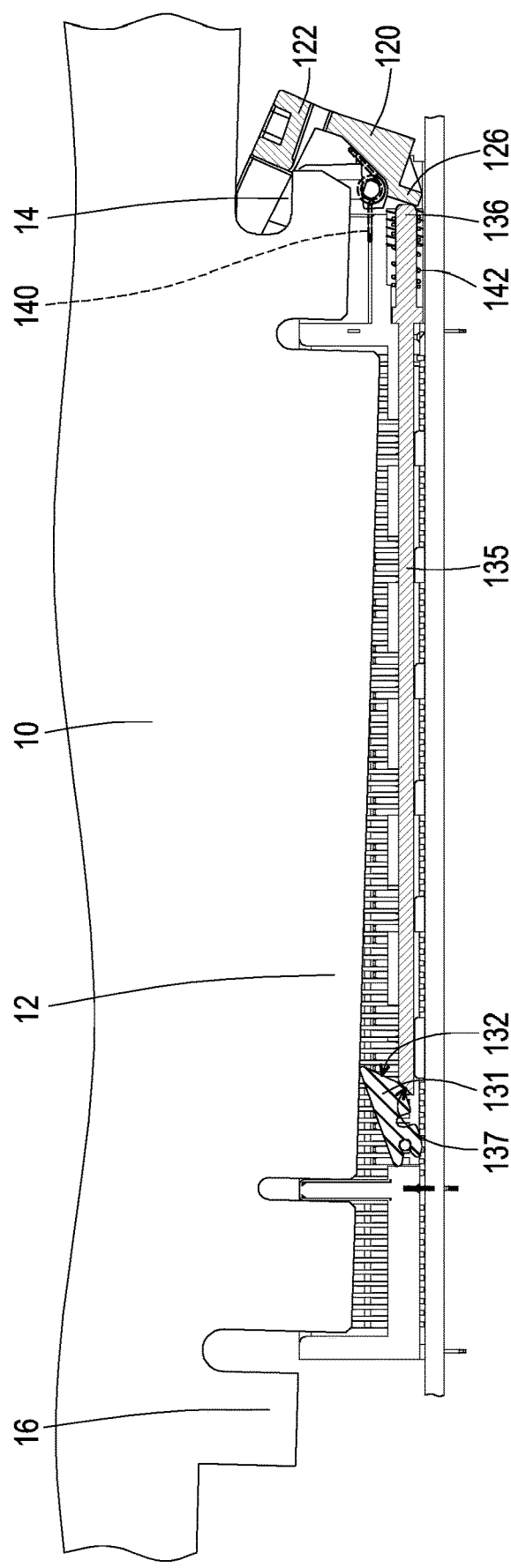
FIG. 1F to FIG. 1G are schematic views of a process of removing the expansion card from the circuit board in FIG. 1A.
Figure 1G:
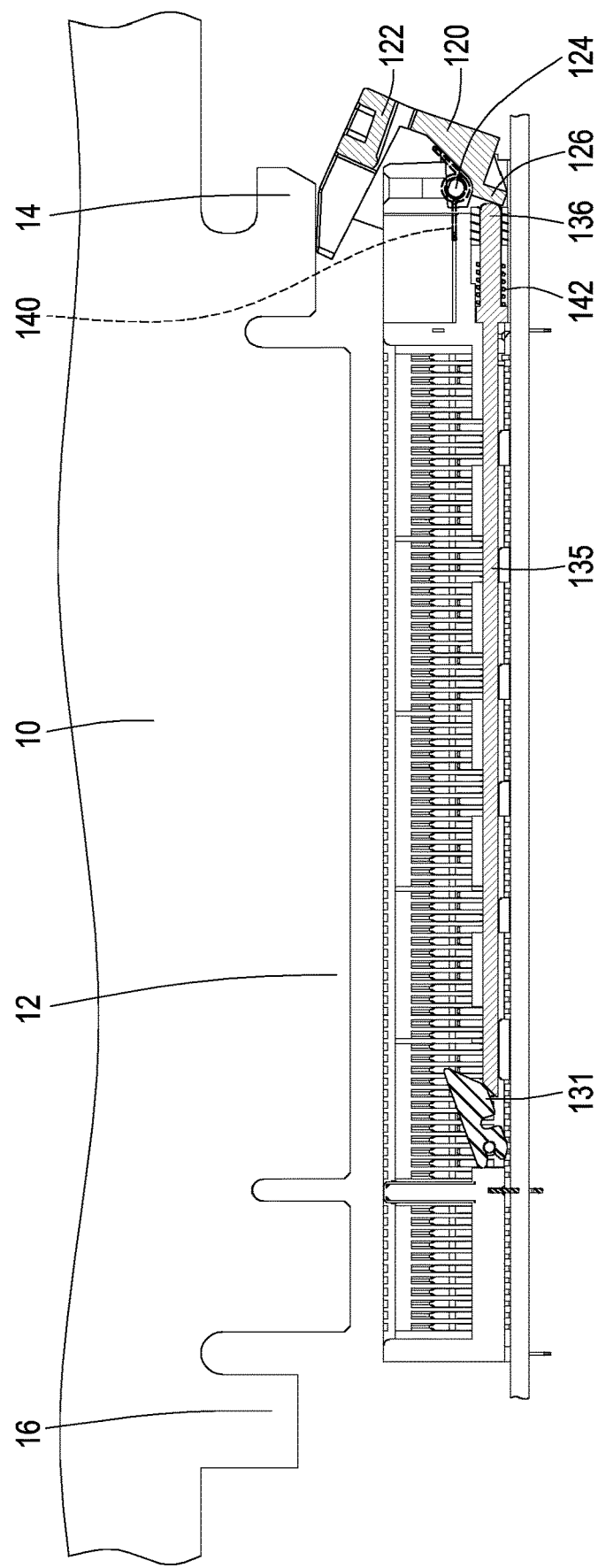

FIG. 1F to FIG. 1G are schematic views of a removal process of removing the expansion card from the circuit board in FIG. 1A. Please refer to FIG. 1F to FIG. 1G. When the expansion card 10 is subjected to an upward force so that the electrical contact part 12 is removed from the socket 112, since the driving member 131 is no longer pressed by the electrical contact part 12, the first elastic member 140 releases the elastic force to push the release structure 120 to rotate, at the same time, the second elastic member 142 releases the elastic force to pull the release structure 120 to rotate. Limiting from the limiting part 122 of the release structure 120 to the positioning part 14 of the expansion card 10 is then released, and the first pushing part 126 of the release structure 120 pushes the second pushing part 136 of the linking member 135, thereby causing the driving member 131 to return.

That is to say, when the expansion card 10 moves upward, the driving member 131, the linking member 135, and the release structure 120 may automatically return, and the buckling of the release structure 120 to the positioning part 14 of the expansion card 10 is released. Therefore, a user does not need to additionally press the release structure 120 or other mechanisms linked to the release structure 120, and the operation is convenient.

Figure 2A:
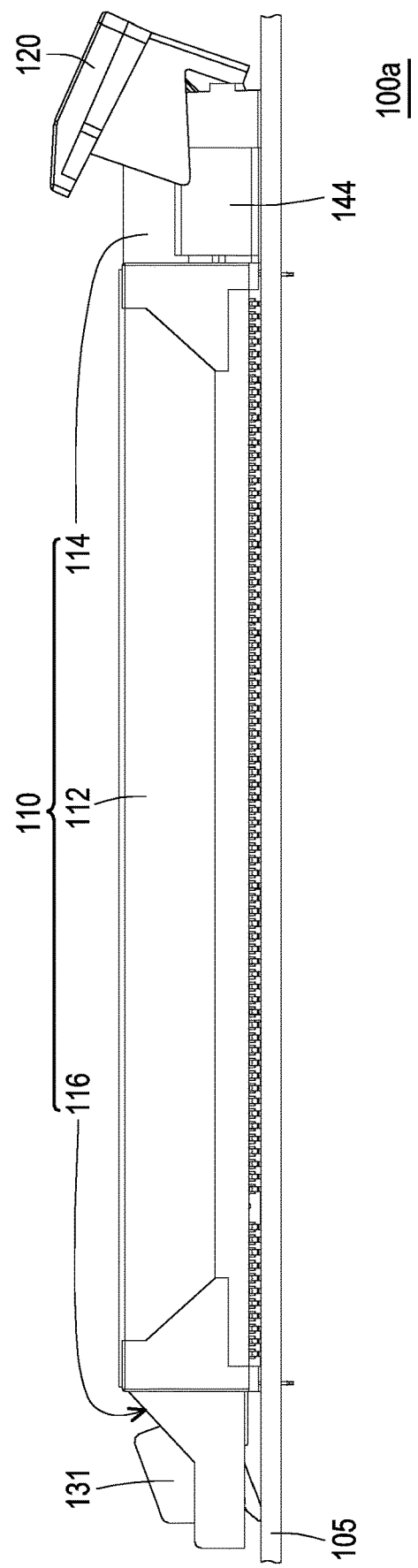
FIG. 2A is a schematic view of an appearance of a circuit board according to another embodiment of the disclosure.
Figure 2B:
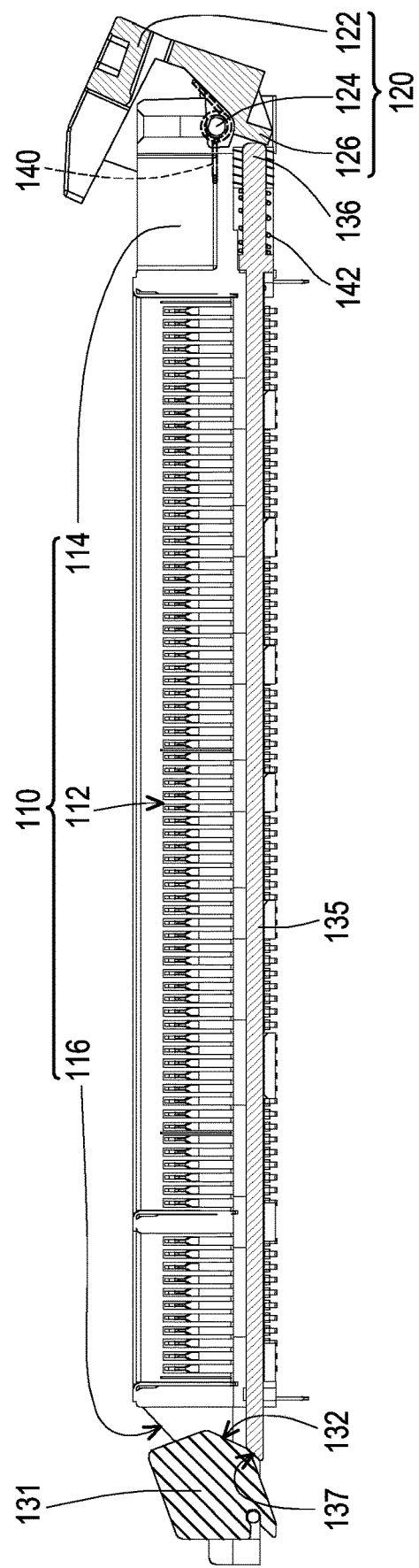
FIG. 2B is a schematic cross-sectional view of FIG. 2A.
Figure 2C:
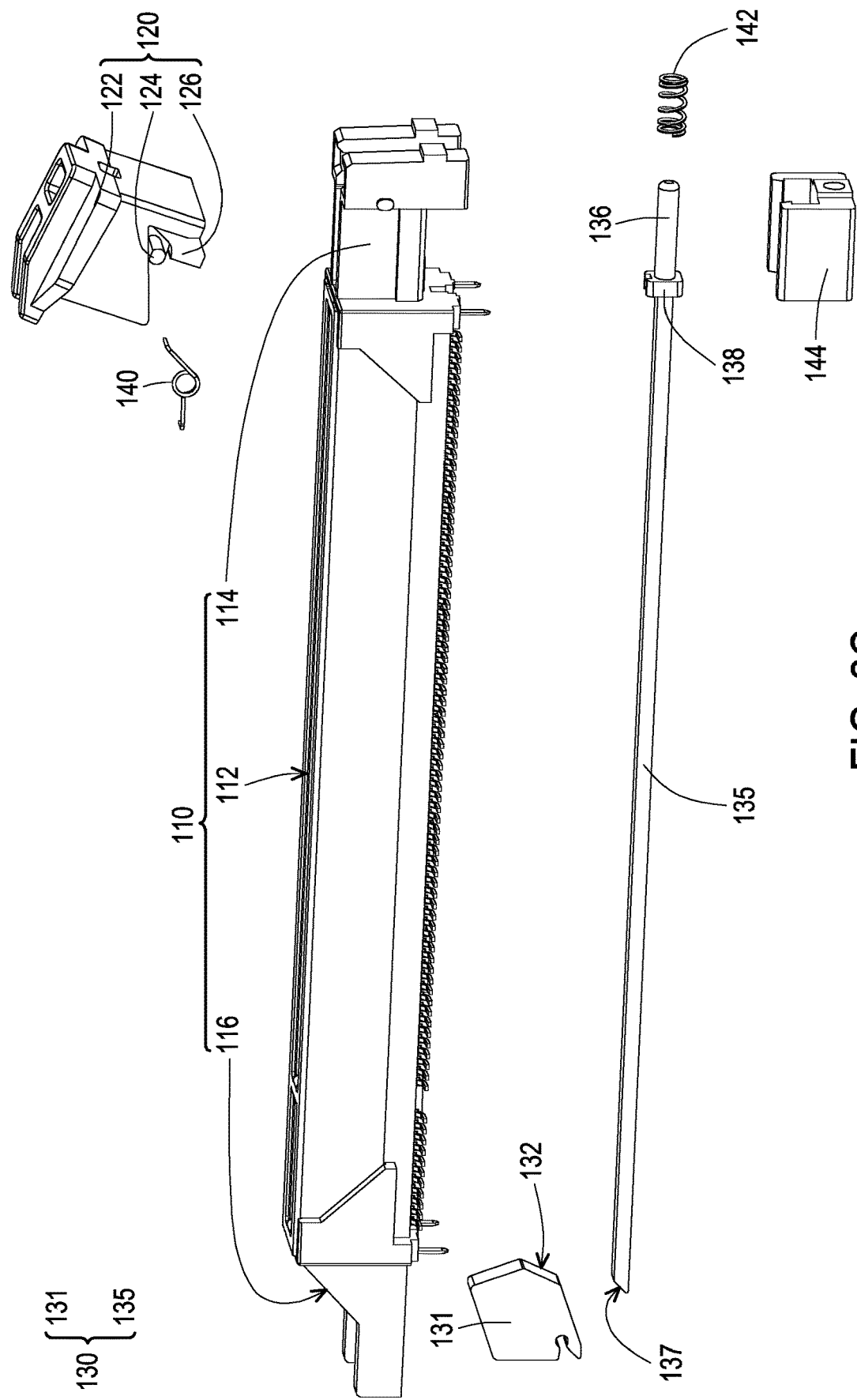
FIG. 2C is an exploded schematic view of FIG. 2A.
Figure 2D:
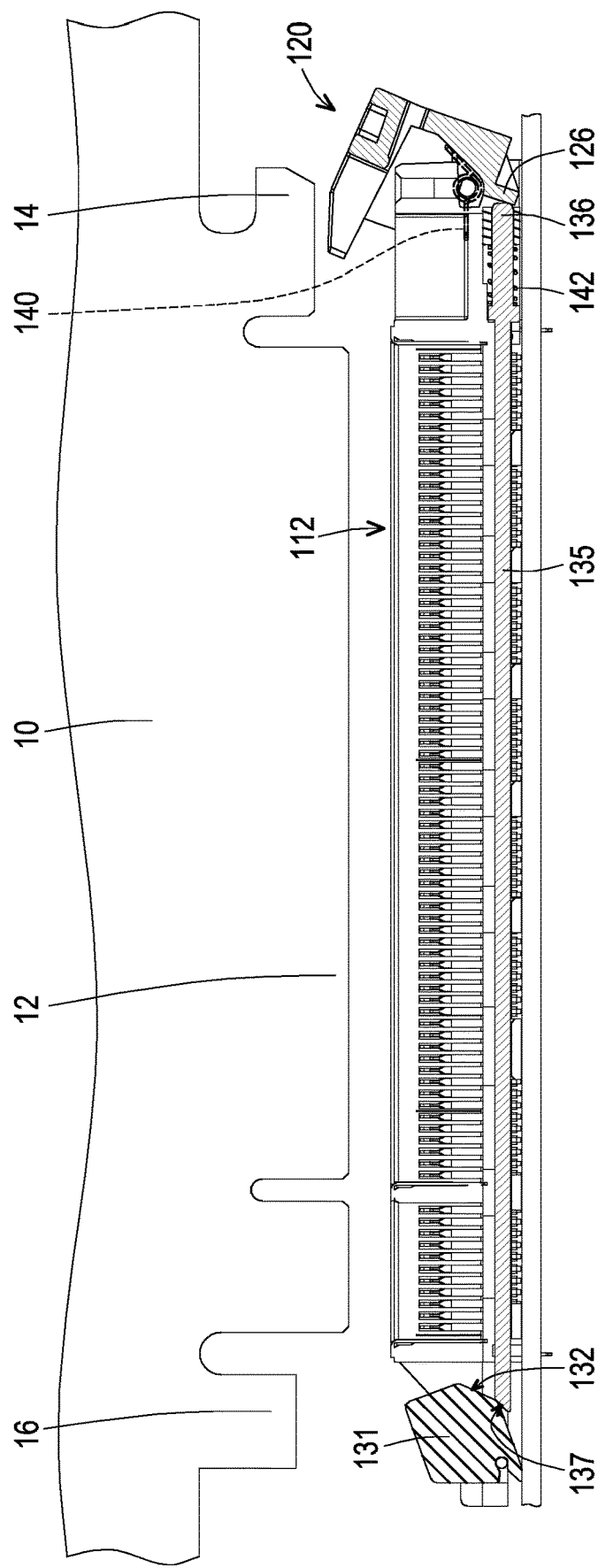
FIG. 2D to FIG. 2E are schematic views of a process of installing an expansion card to the circuit board in FIG. 2A.
Figure 2E:
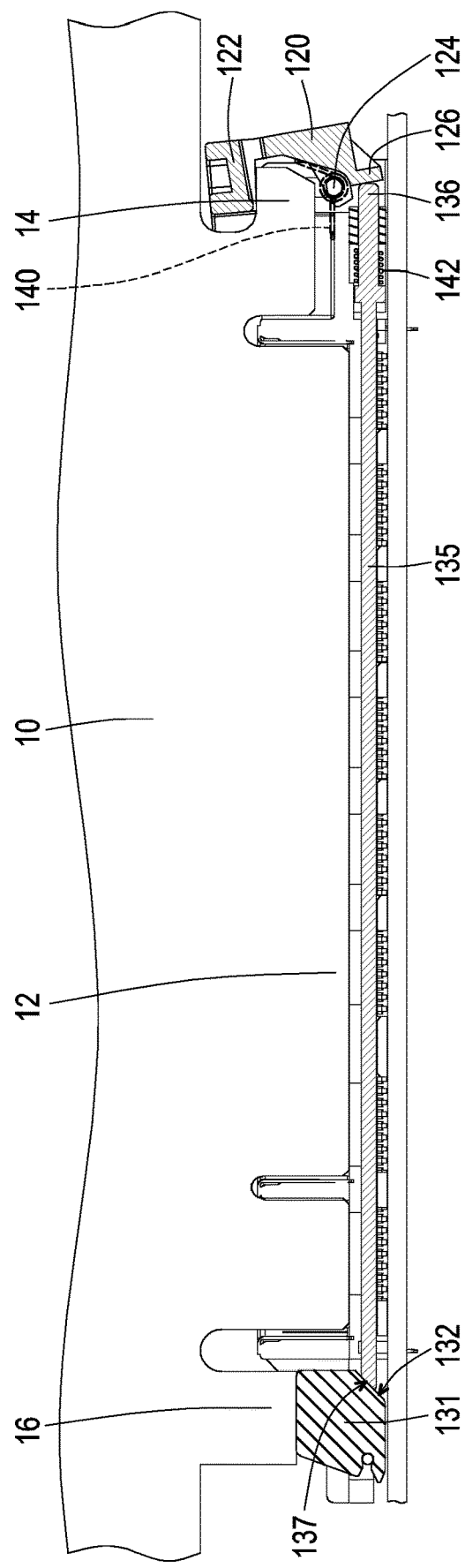
Figure 2F:
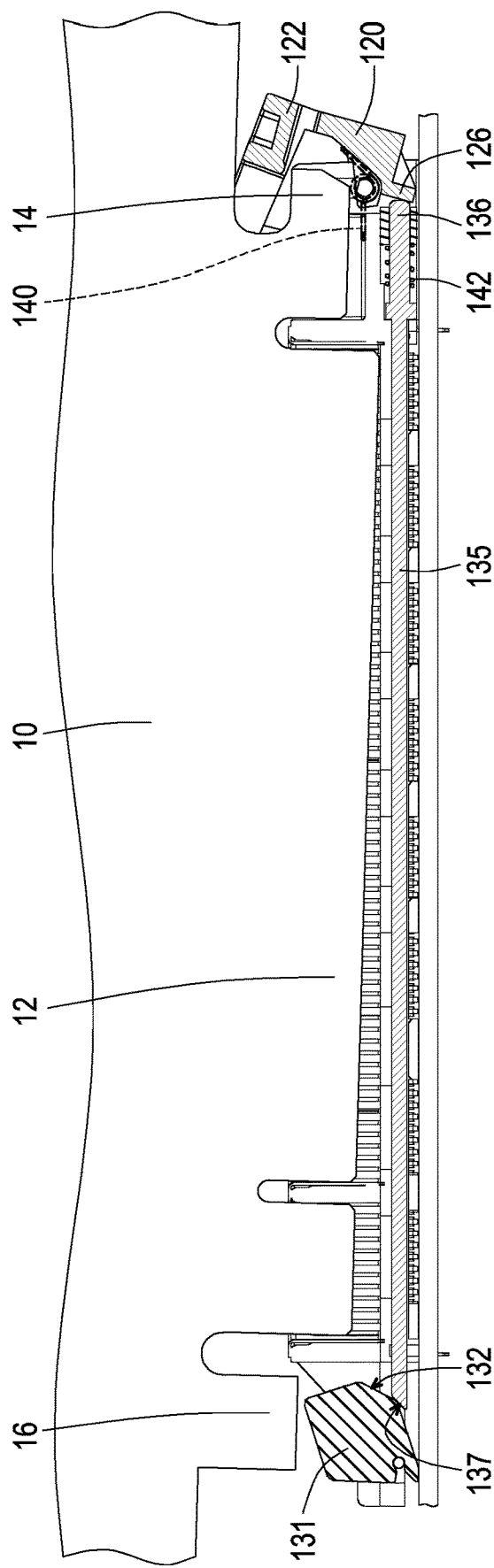
FIG. 2F to FIG. 2G are schematic views of a process of removing the expansion card from the circuit board in FIG. 2A.
Figure 2G:
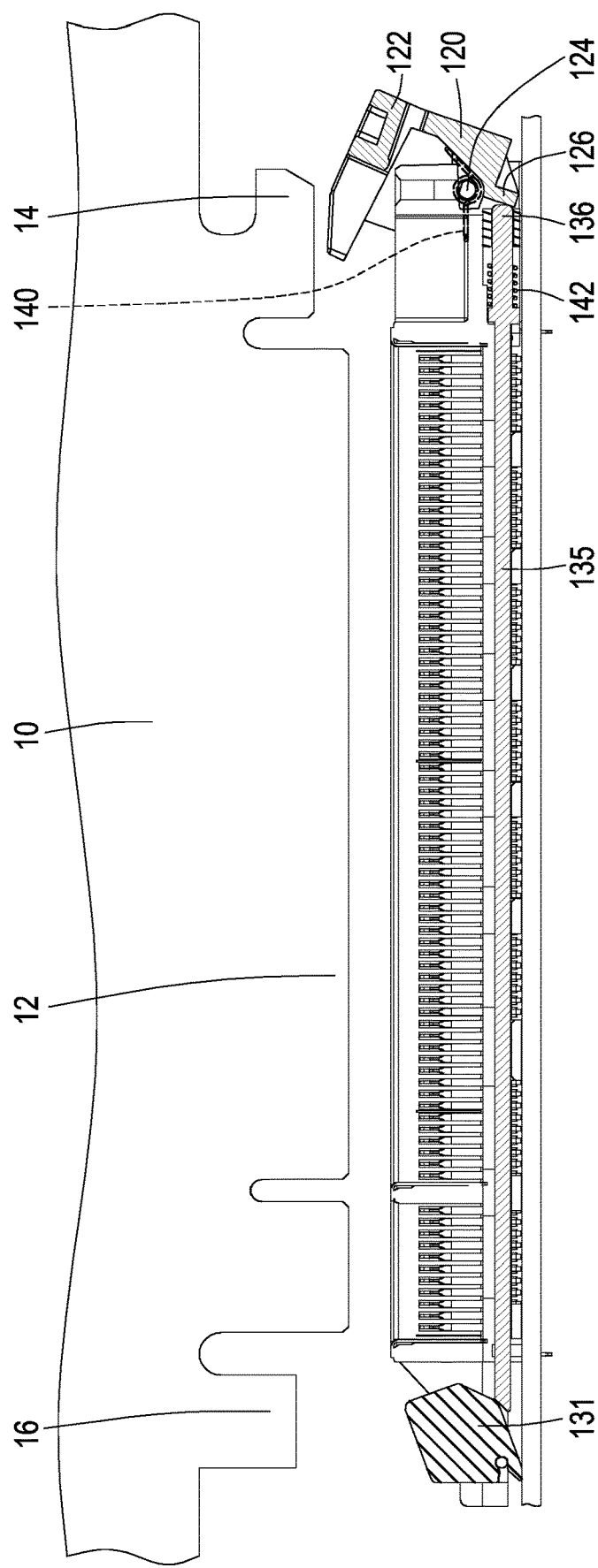

FIG. 2A is a schematic view of an appearance of a circuit board according to another embodiment of the disclosure. FIG. 2B is a schematic cross-sectional view of FIG. 2A. FIG. 2C is an exploded schematic view of FIG. 2A. FIG. 2D to FIG. 2E are schematic views of a process of installing an expansion card to the circuit board in FIG. 2A. FIG. 2F to FIG. 2G are schematic views of a process of removing the expansion card from the circuit board in FIG. 2A.

Referring to FIG. 2A to FIG. 2G, the main difference between a circuit board 100a of this embodiment and the circuit board 100 of the previous embodiment is that in this embodiment, the driving member 131 is disposed beside the outer surface 116 and exposed to the slot 110. The driving member 131 is adapted for being pressed down by the non-electrical convex part 16 (FIG. 2D) of the expansion card 10 (FIG. 2D) to move.

As shown in FIG. 2D to FIG. 2E, in this embodiment, when the electrical contact part 12 of the expansion card 10 is inserted into the socket 112, the non-electrical convex part 16 presses the driving member 131, and the driving member 131 is pressed down. The first bevel 132 of the driving member 131 pushes the second bevel 137 of the linking member 135, and drives the linking member 135 to move toward the release structure 120, so that the second pushing part 136 of the linking member 135 pushes the first pushing part 126 of the release structure 120, the release structure 120 rotates correspondingly about the pivot 124 as an axis, as shown in FIG. 2E, and the limiting part 122 of the release structure 120 is limiting to the positioning part 14 of the expansion card 10. At this time, the first elastic member 140 and the second elastic member 142 accumulate an elastic force.

As shown in FIG. 2F to FIG. 2G, when the expansion card 10 is subjected to an upward force so that the electrical contact part 12 is removed from the socket 112, since the driving member 131 is no longer pressed by the non-electrical convex part 16, the first elastic member 140 releases the elastic force to push the release structure 120 to rotate, at the same time, the second elastic member 142 releases the elastic force to pull the release structure 120 to rotate. Limiting from the limiting part 122 of the release structure 120 to the positioning part 14 of the expansion card 10 is then released, and the first pushing part 126 of the release structure 120 pushes the second pushing part 136 of the linking member 135, thereby causing the driving member 131 to return.

Likewise, in this embodiment, when the expansion card 10 moves upward, the driving member 131, the linking member 135, and the release structure 120 may automatically return, and the buckling of the release structure 120 to the positioning part 14 of the expansion card 10 is released. Therefore, the user does not need to additionally press the release structure 120 or other mechanisms linked to the release structure 120, and the operation is convenient.

Figure 3B:
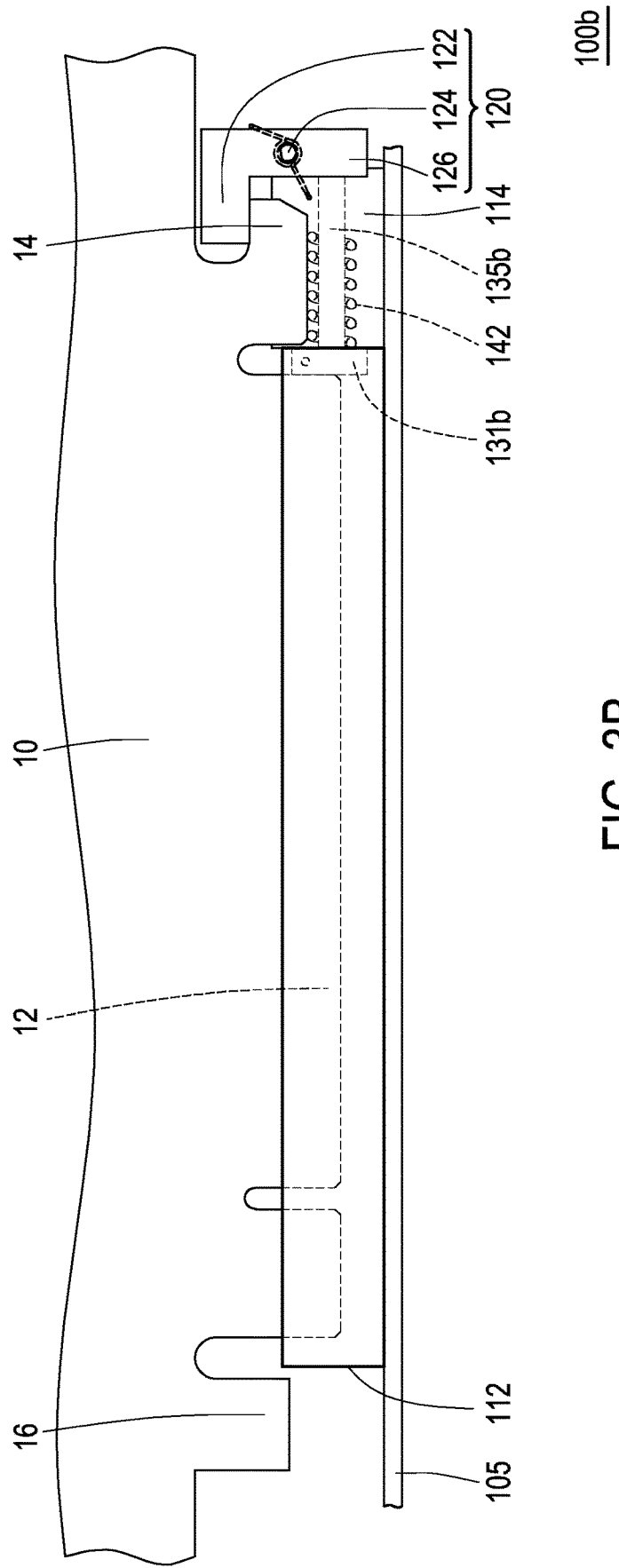

FIG. 3A to FIG. 3B are schematic views of a process of inserting an expansion card into a circuit board according to another embodiment of the disclosure. Referring to FIG. 3A to FIG. 3B, the main difference between a circuit board 100b of this embodiment and the circuit board 100 of FIG. 1B is the form and position of a driving member 131b. In this embodiment, the driving member 131b is disposed at a part in the socket 112 near the connecting end 114, and an upper end of the driving member 131b is pivotally connected to a part near a junction of the socket 112 and the connecting end 114.

When the expansion card 10 is not inserted, a lower end of the driving member 131b reaches obliquely into the socket 112. When the electrical contact part 12 of the expansion card 10 is inserted into the socket 112, the electrical contact part 12 pushes the driving member 131b, so that the driving member 131b rotates, thereby pushing a linking member 135b, and the linking member 135b pushes the first pushing part 126 of the release structure 120, the release structure 120 rotates correspondingly about the pivot 124 as an axis, as shown in FIG. 3B, and the limiting part 122 of the release structure 120 is limiting to the positioning part 14 of the expansion card 10. At this time, the first elastic member 140 and the second elastic member 142 accumulate an elastic force.

When the expansion card 10 is subjected to an upward force so that the electrical contact part 12 is removed from the socket 112, since the driving member 131b is no longer pressed by the electrical contact part 12, the first elastic member 140 releases the elastic force to push the release structure 120 to rotate, at the same time, the second elastic member 142 releases the elastic force to pull the release structure 120 to rotate. Limiting from the limiting part 122 of the release structure 120 to the positioning part 14 of the expansion card 10 is then released, and the first pushing part 126 of the release structure 120 pushes the linking member 135b, thereby causing the driving member 131b to return to a position as in FIG. 3A.

Figure 4A:
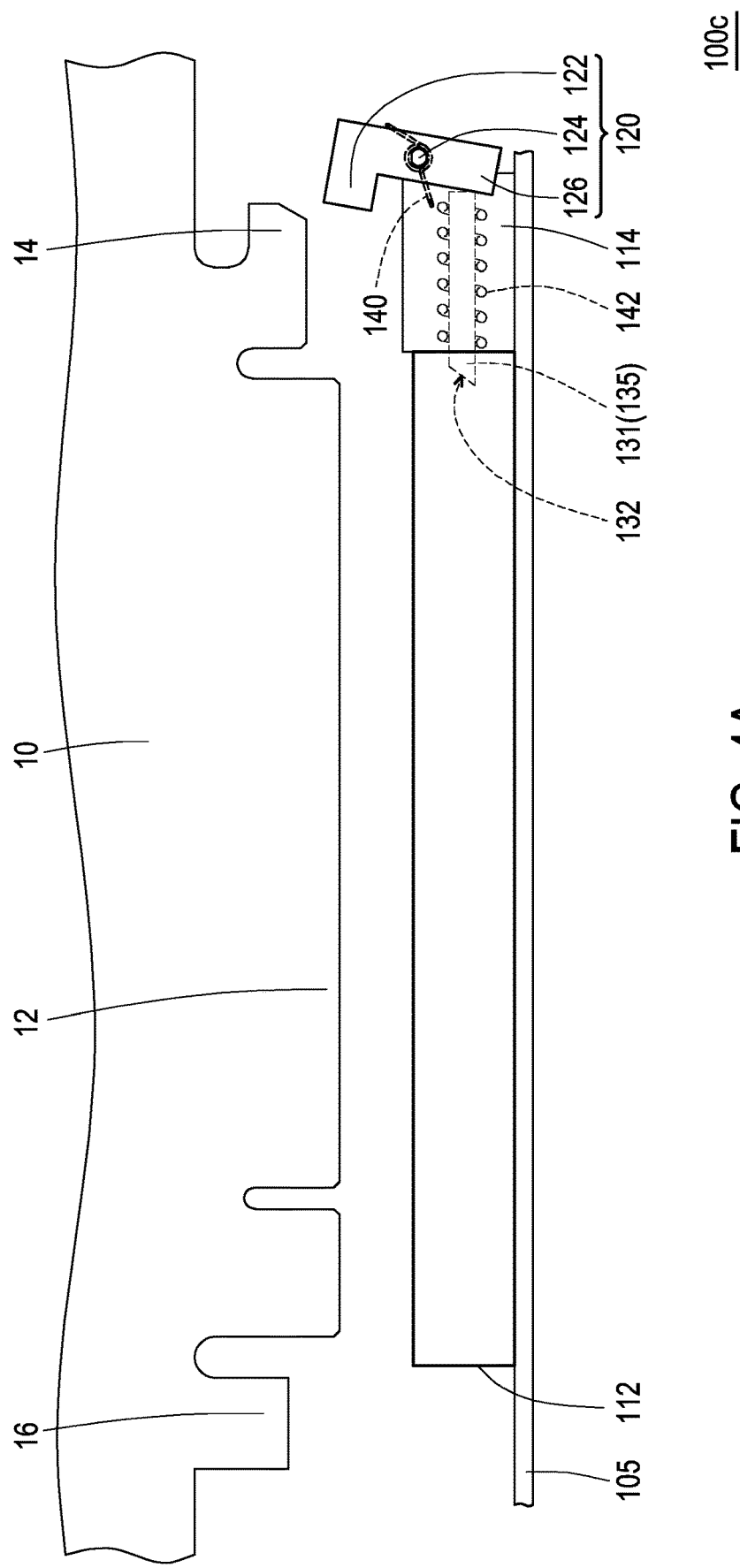
FIG. 4A to FIG. 4B are schematic views of a process of inserting an expansion card into a circuit board according to another embodiment of the disclosure.
Figure 4B:
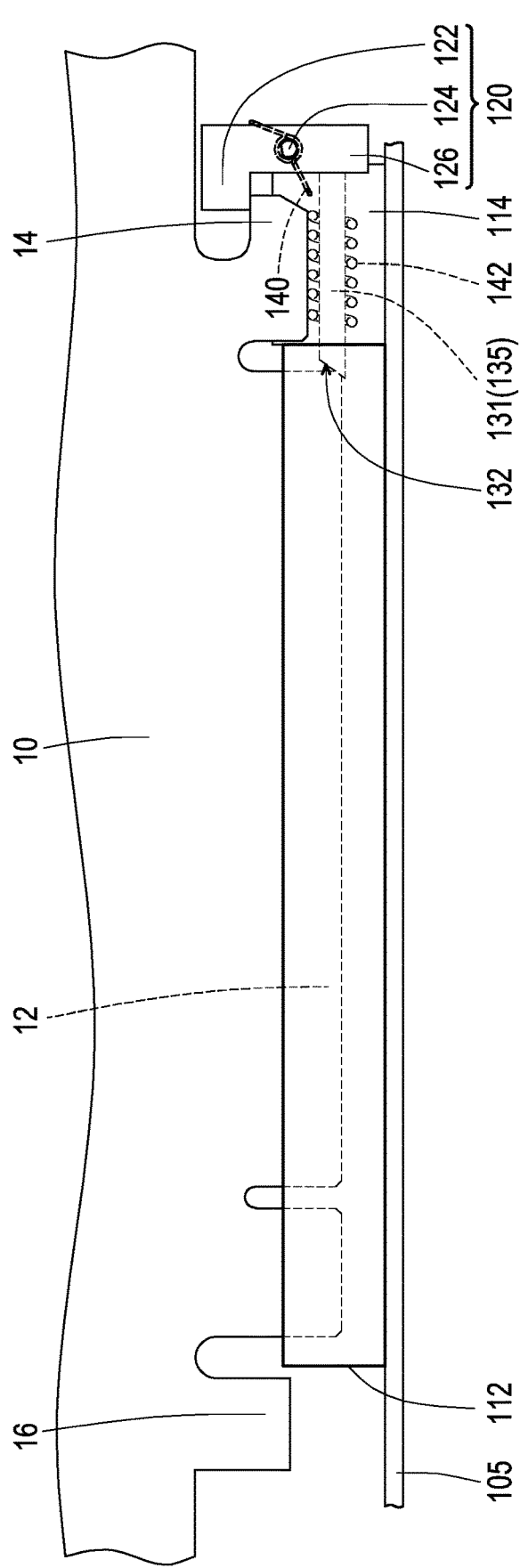

FIG. 4A to FIG. 4B are schematic views of a process of inserting an expansion card into a circuit board according to another embodiment of the disclosure. Please refer to FIG. 4A to FIG. 4B, the main difference between a circuit board 100c of FIG. 4A and the circuit board 100b of FIG. 3A is that, in this embodiment, the driving member 131 and the linking member 135 are integrated. The driving member 131 includes the first bevel 132 reaching into the socket 112.

When the expansion card 10 is not inserted, the first bevel 132 of the driving member 131 reaches into the socket 112. When the electrical contact part 12 of the expansion card 10 is inserted into the socket 112, the electrical contact part 12 pushes the first bevel 132 of the driving member 131, so that the driving member 131 moves to the right, the second pushing part 136 of the linking member 135 pushes the first pushing part 126 of the release structure 120, the release structure 120 rotates correspondingly about the pivot 124 as an axis, as shown in FIG. 4B, and the limiting part 122 of the release structure 120 is limiting to the positioning part 14 of the expansion card 10. At this time, the first elastic member 140 and the second elastic member 142 accumulate an elastic force.

When the expansion card 10 is subjected to an upward force so that the electrical contact part 12 is removed from the socket 112, since the driving member 131 is no longer pressed by the electrical contact part 12, the first elastic member 140 releases the elastic force to push the release structure 120 to rotate, at the same time, the second elastic member 142 releases the elastic force to pull the release structure 120 to rotate. Limiting from the limiting part 122 of the release structure 120 to the positioning part 14 of the expansion card 10 is then released, and the first pushing part 126 of the release structure 120 pushes the second pushing part 136 of the linking member 135, thereby causing the driving member 131 to return to a position as in FIG. 4A. It is worth mentioning that the actuation mode of the release structure is not limited to rotation, and other actuation modes of the release structure will be described in the following embodiments.

Figure 5A:
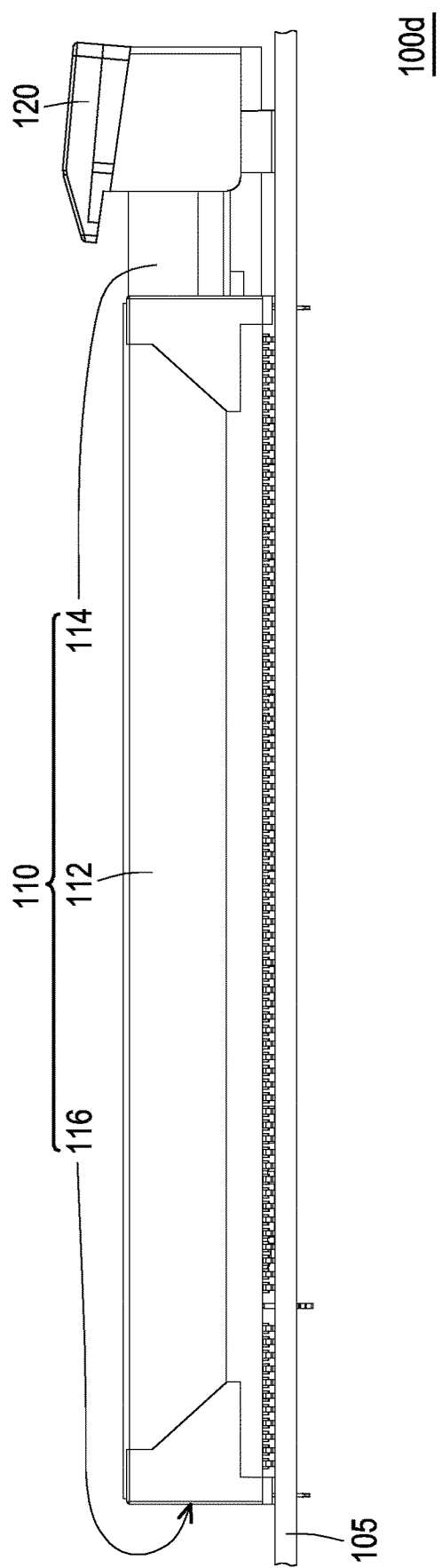
FIG. 5A is a schematic view of an appearance of a circuit board according to another embodiment of the disclosure.
Figure 5B:
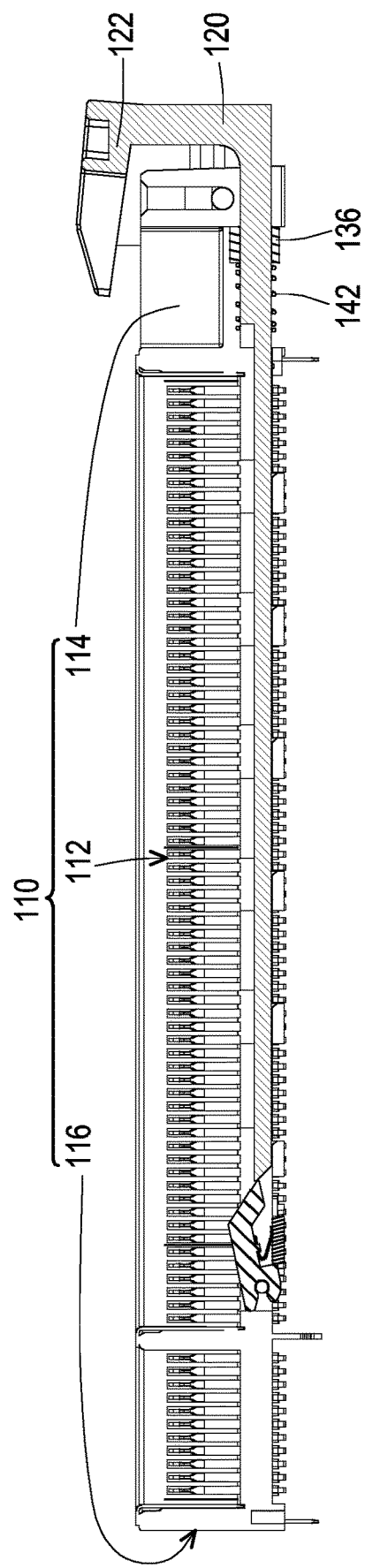
FIG. 5B is a schematic cross-sectional view of FIG. 5A.
Figure 5C:
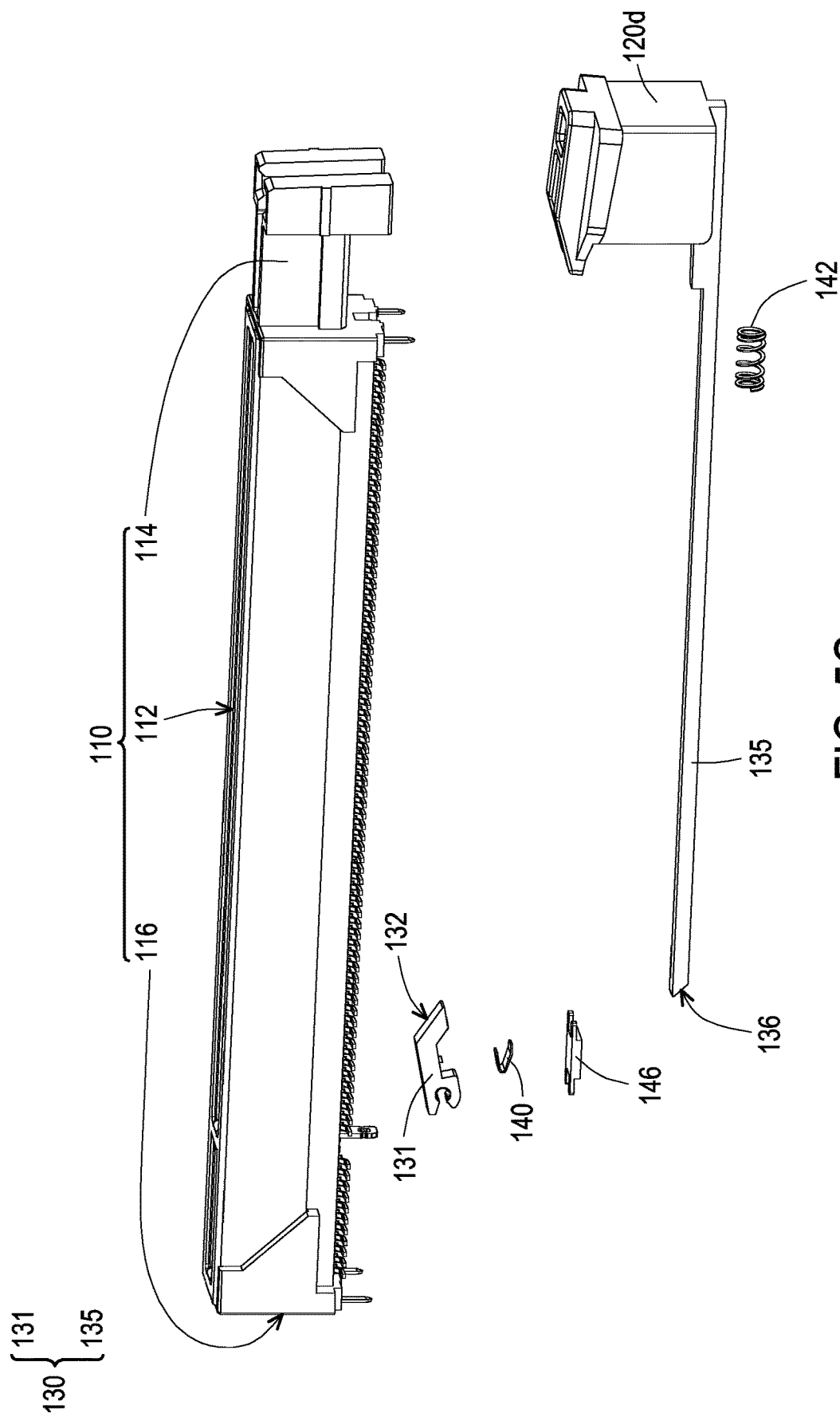
FIG. 5C is an exploded schematic view of FIG. 5A.

FIG. 5A is a schematic view of an appearance of a circuit board according to another embodiment of the disclosure. FIG. 5B is a schematic cross-sectional view of FIG. 5A. FIG. 5C is an exploded schematic view of FIG. 5A. Referring to FIG. 5A to FIG. 5C, the main difference between a circuit board 100d of this embodiment and the circuit board 100 of FIG. 1B is the form and disposed position of the first elastic member 140 (FIG. 5C), the form of the second elastic member 142, the linking member 135 and the release structure 120 are integrated, and the movement mode of the release structure 120.

As shown in FIG. 5C, in this embodiment, the first elastic member 140 is disposed below the driving member 131, and the first elastic member 140 may be a leaf spring, but is not limited thereto. The first elastic member 140 is disposed between a fixing base 146 and the driving member 131. The second elastic member 142 is pre-stretched and disposed between the release structure 120 and the connecting end 114, and an elastic coefficient of the first elastic member 140 is greater than an elastic coefficient of the second elastic member 142.

Figure 5D:
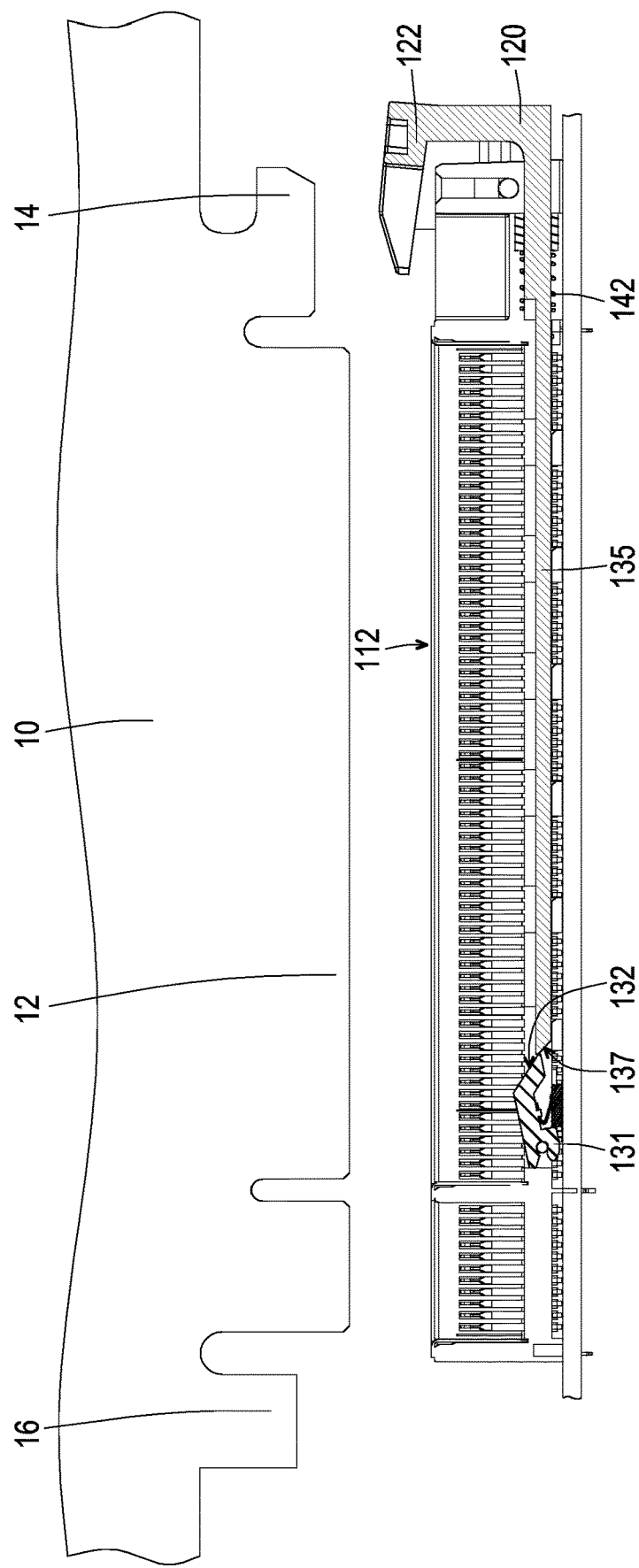
FIG. 5D to FIG. 5E are schematic views of a process of installing an expansion card to the circuit board in FIG. 5A.
Figure 5E:
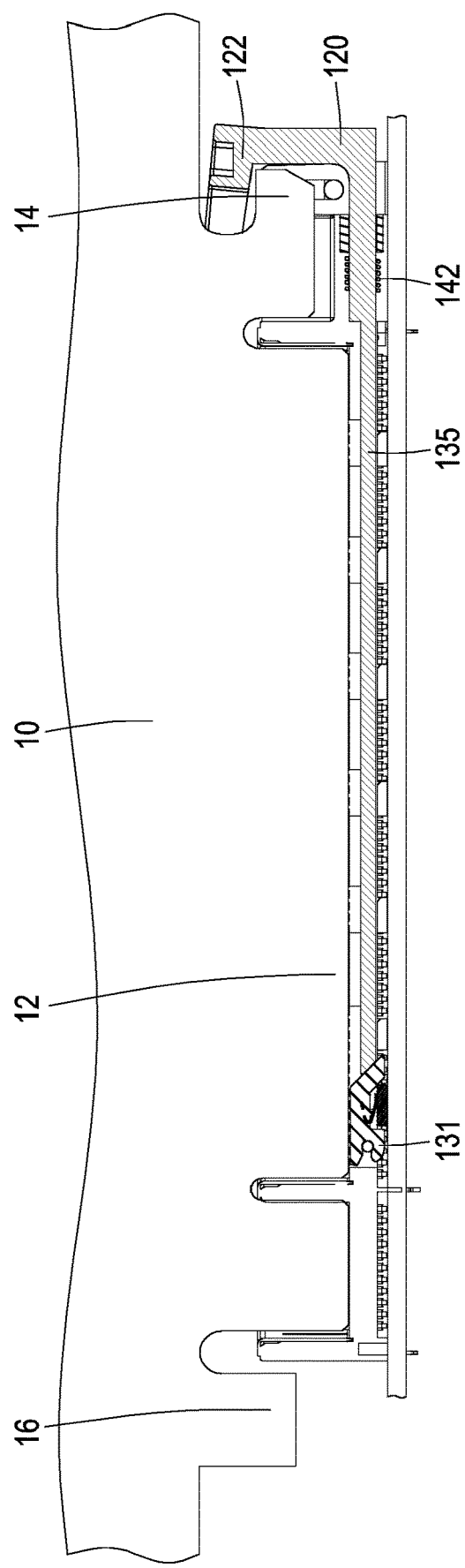

FIG. 5D to FIG. 5E are schematic views of a process of installing an expansion card to the circuit board in FIG. 5A. Please refer to FIG. 5D, when the expansion card 10 is not inserted into the socket 112, since the elastic coefficient of the first elastic member 140 is greater than the elastic coefficient of the second elastic member 142, the first elastic member 140 pushes the driving member 131 upward, and an bottom end of the first bevel 132 of the driving member 131 abuts a top end of the second bevel 137 of the linking member 135. At this time, the second elastic member 142 is pre-stretched to accumulate an elastic force.

Please refer to FIG. 5E, when the electrical contact part 12 of the expansion card 10 is inserted into the socket 112, the electrical contact part 12 presses the driving member 131, the driving member 131 moves down, the first elastic member 140 accumulates an elastic force, and the first bevel 132 of the driving member 131 moves away from the second bevel 137, leaving room for the linking member 135 to move toward a direction away from the release structure 120. At this time, the second elastic member 142 releases the elastic force to drive the release structure 120 to move (to the left) toward the socket 112, so that the limiting part 122 of the release structure 120 is limiting to the positioning part 14 of the expansion card 10, and the first bevel 132 again abuts the second bevel 137.

Figure 5F:
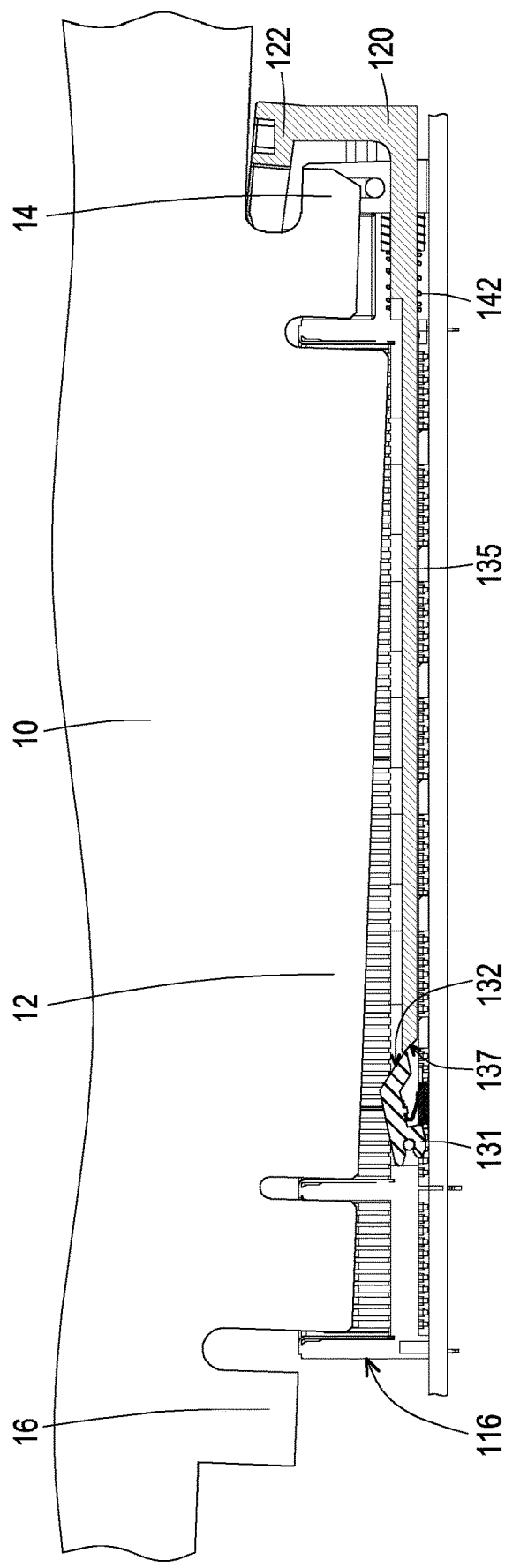
FIG. 5F to FIG. 5G are schematic views of a process of removing the expansion card from the circuit board in FIG. 5A.
Figure 5G:
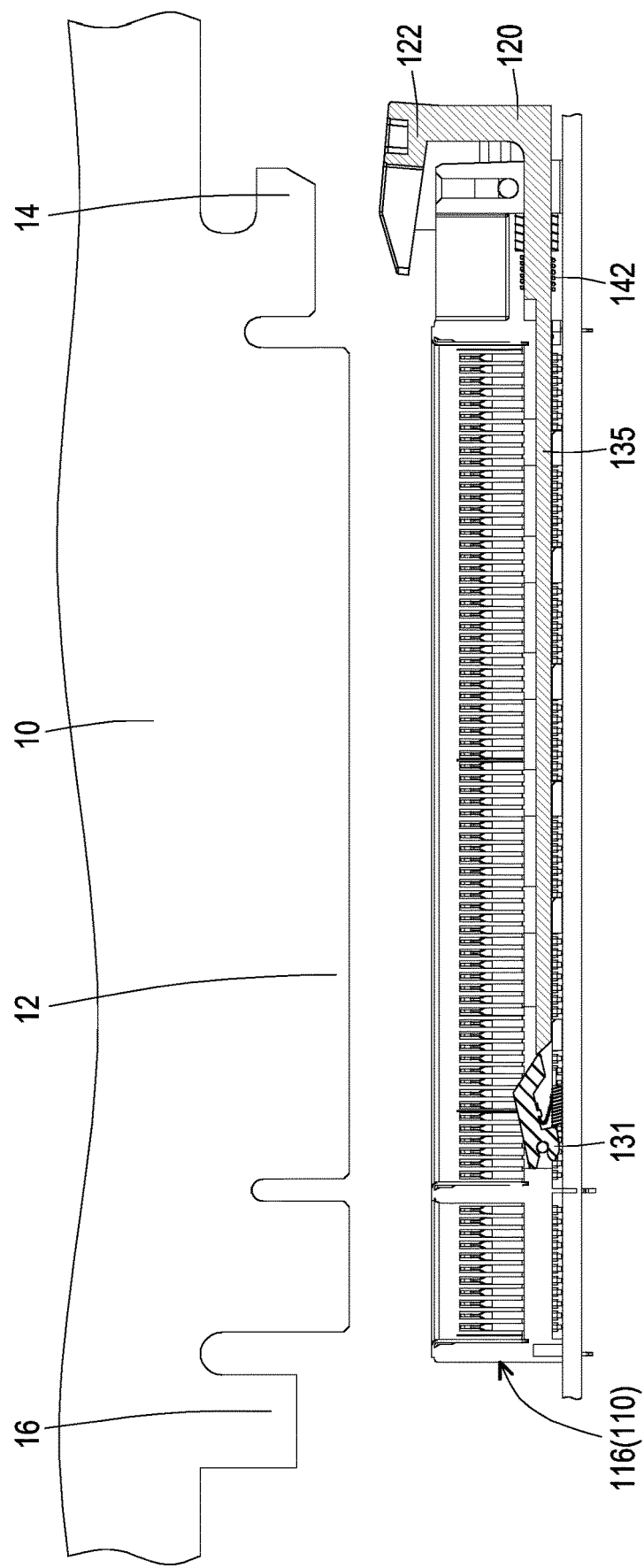

FIG. 5F to FIG. 5G are schematic views of a process of removing the expansion card from the circuit board in FIG. 5A. Please refer to FIG. 5F, when the electrical contact part 12 of the expansion card 10 is removed from the socket 112, the driving member 131 is no longer pressed down by the electrical contact part 12, and the first elastic member 140 releases the elastic force to push the driving member 131 upward to return, and the first bevel 132 of the driving member 131 pushes the second bevel 137 of the linking member 135, so that the linking member 135 and the release structure 120 move to the right, the release structure 120 moves in a direction away from the socket 112, and limiting from the limiting part 122 of the release structure 120 to the positioning part 14 of the expansion card 10 is released.

Of course, in other embodiments, a position of the driving member 131 may also be disposed outside the outer surface 116 and exposed to the slot 110, so as to be pressed by the non-electrical convex part 16, and a position of the driving member 131 is not limited thereto.

Figure 6A:
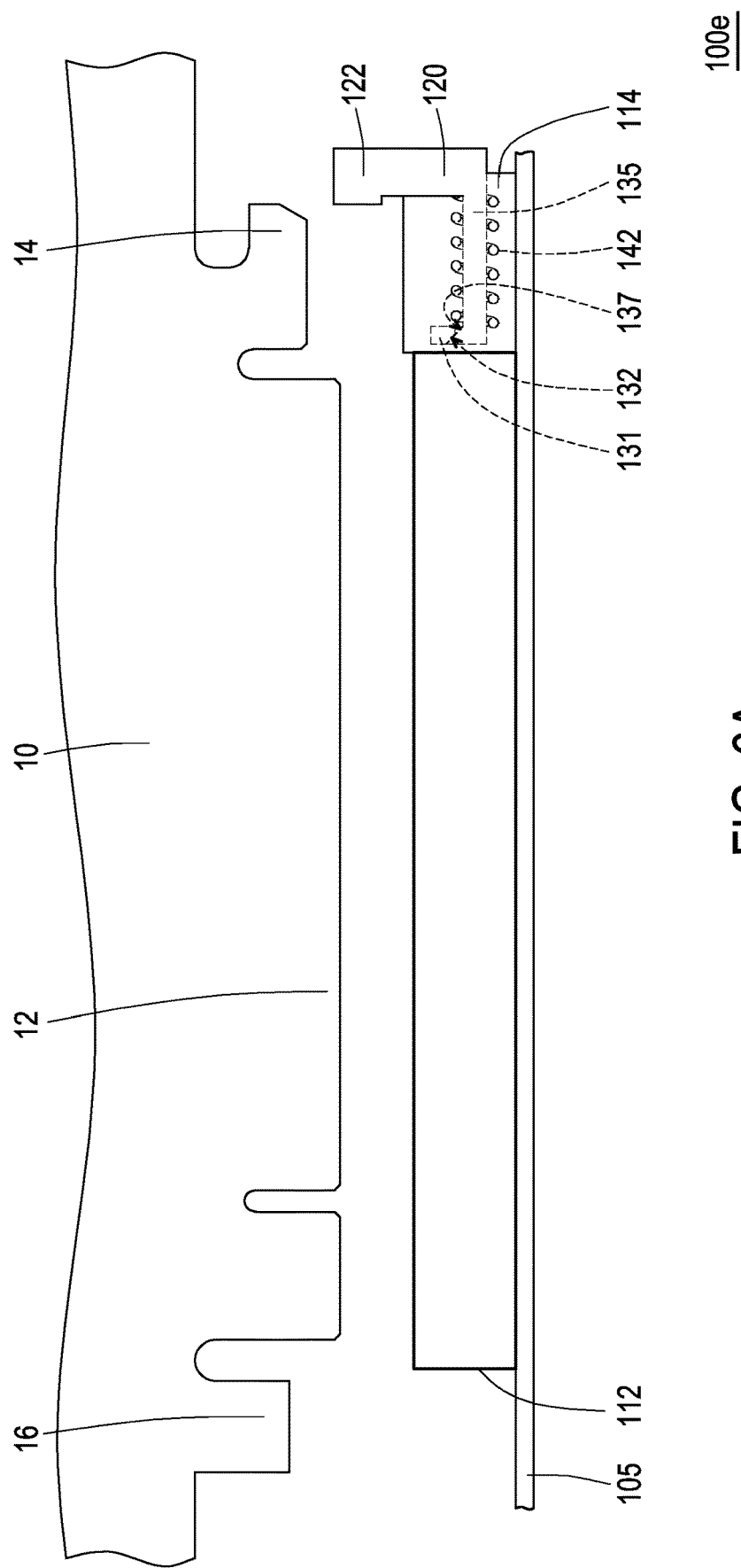
FIG. 6A to FIG. 6B are schematic views of a process of inserting an expansion card into a circuit board according to another embodiment of the disclosure.
Figure 6B:
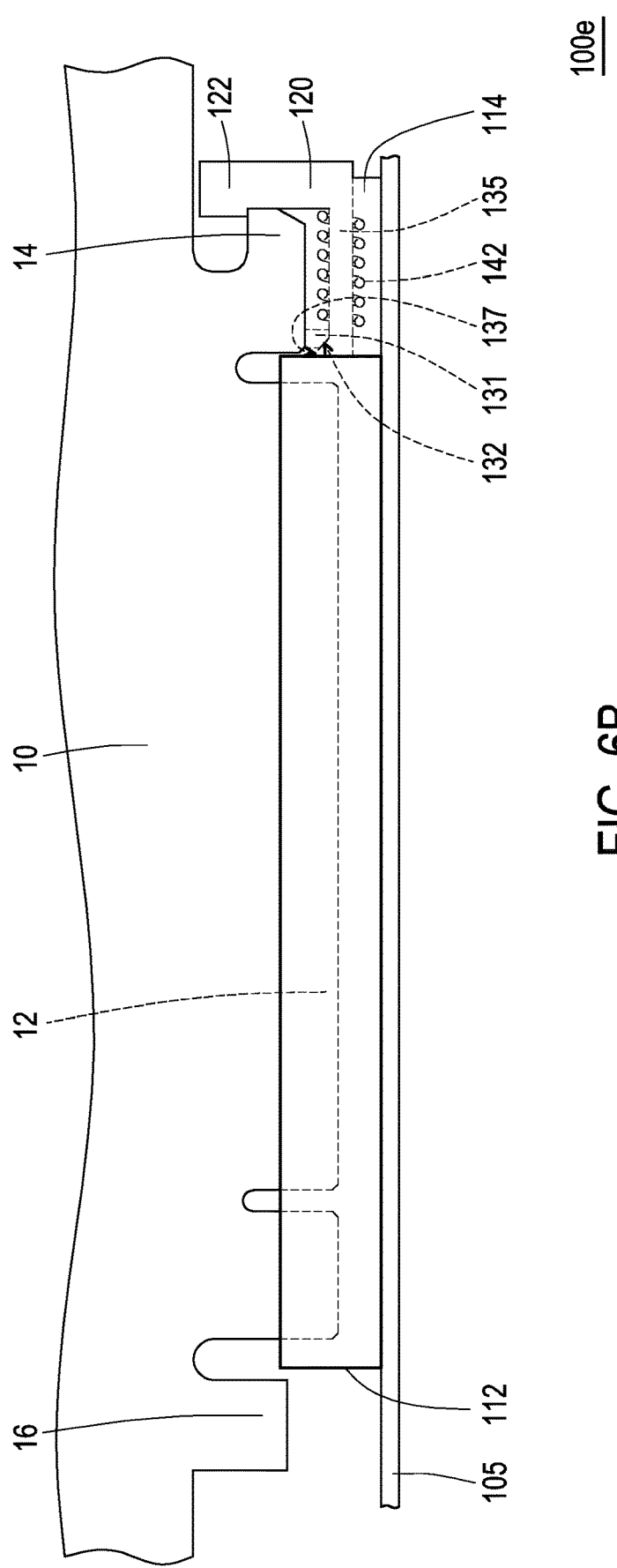

FIG. 6A to FIG. 6B are schematic views of a process of inserting an expansion card into a circuit board according to another embodiment of the disclosure. Referring to FIG. 6A to FIG. 6B, in a circuit board 100e of this embodiment, the driving member 131 is disposed in the connecting end 114, and the driving member 131 is adapted for being pressed down by the positioning part 14 of the expansion card 10 to move. The release structure 120 is movably disposed at the connecting end 114, and the linking member 135 and the release structure 120 are integrated. The first elastic member 140 is disposed between the connecting end 114 and the release structure 120.

As shown in FIG. 6B, when the electrical contact part 12 of the expansion card 10 is inserted into the socket 112, the positioning part 14 of the expansion card 10 presses down the driving member 131, the first bevel 132 of the driving member 131 pushes the second bevel 137 of the linking member 135 to drive the release structure 120 to move (to the left) toward the socket 112, so that the limiting part 122 of the release structure 120 is limiting to the positioning part 14 of the expansion card 10. The first elastic member 140 accumulates an elastic force.

When the expansion card 10 is subjected to an upward force so that the electrical contact part 12 of the expansion card 10 is removed from the socket 112, since the driving member 131 is no longer pressed by the positioning part 14, the first elastic member 140 releases the elastic force to push the release structure 120 to move to the right. Limiting from the limiting part 122 of the release structure 120 to the positioning part 14 of the expansion card 10 is then released. The second bevel 137 of the linking member 135 drives the first bevel 132 of the driving member 131, thereby causing the driving member 131 to return upward to a position as in FIG. 6A.

Figure 7A:
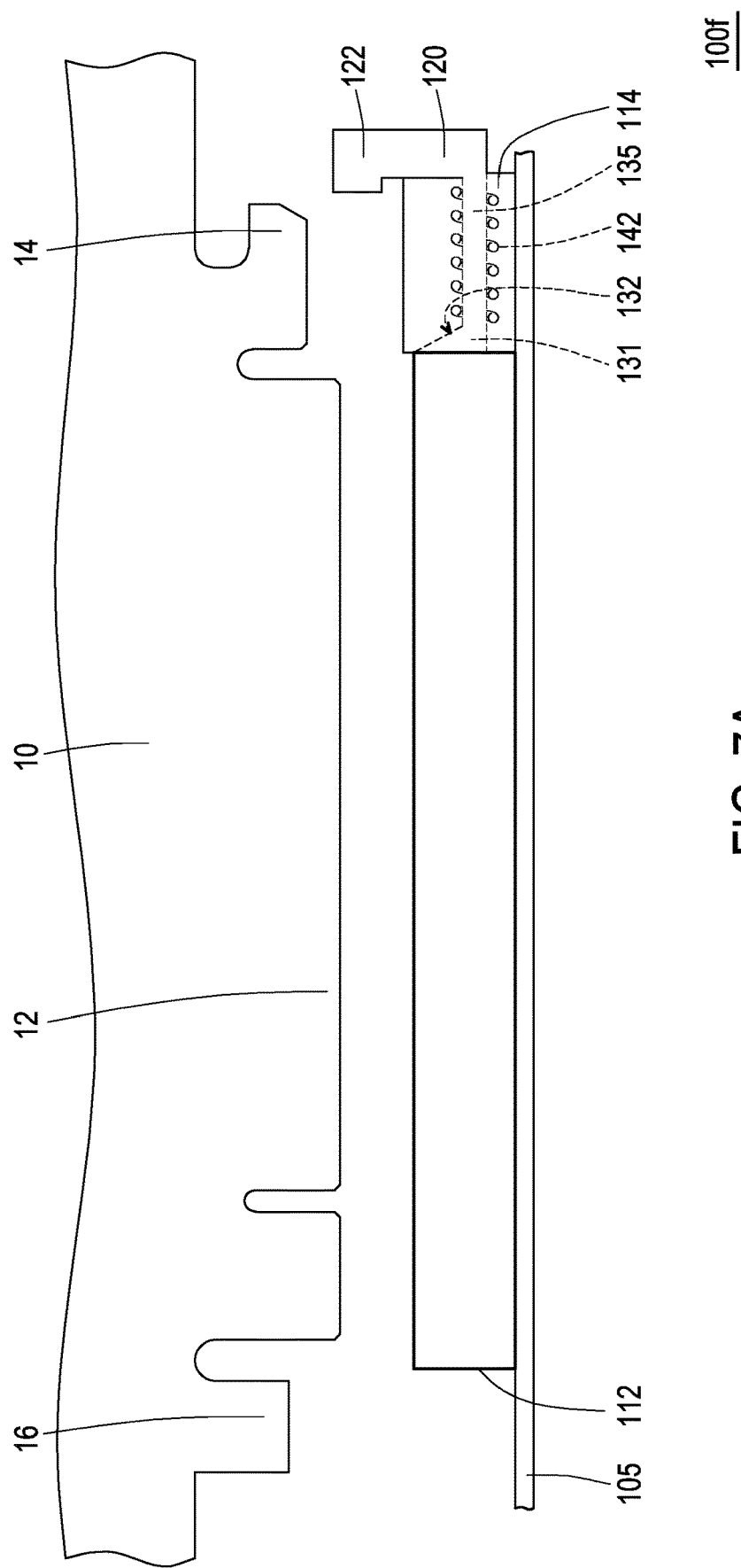
FIG. 7A to FIG. 7B are schematic views of a process of inserting an expansion card into a circuit board according to another embodiment of the disclosure.
Figure 7B:
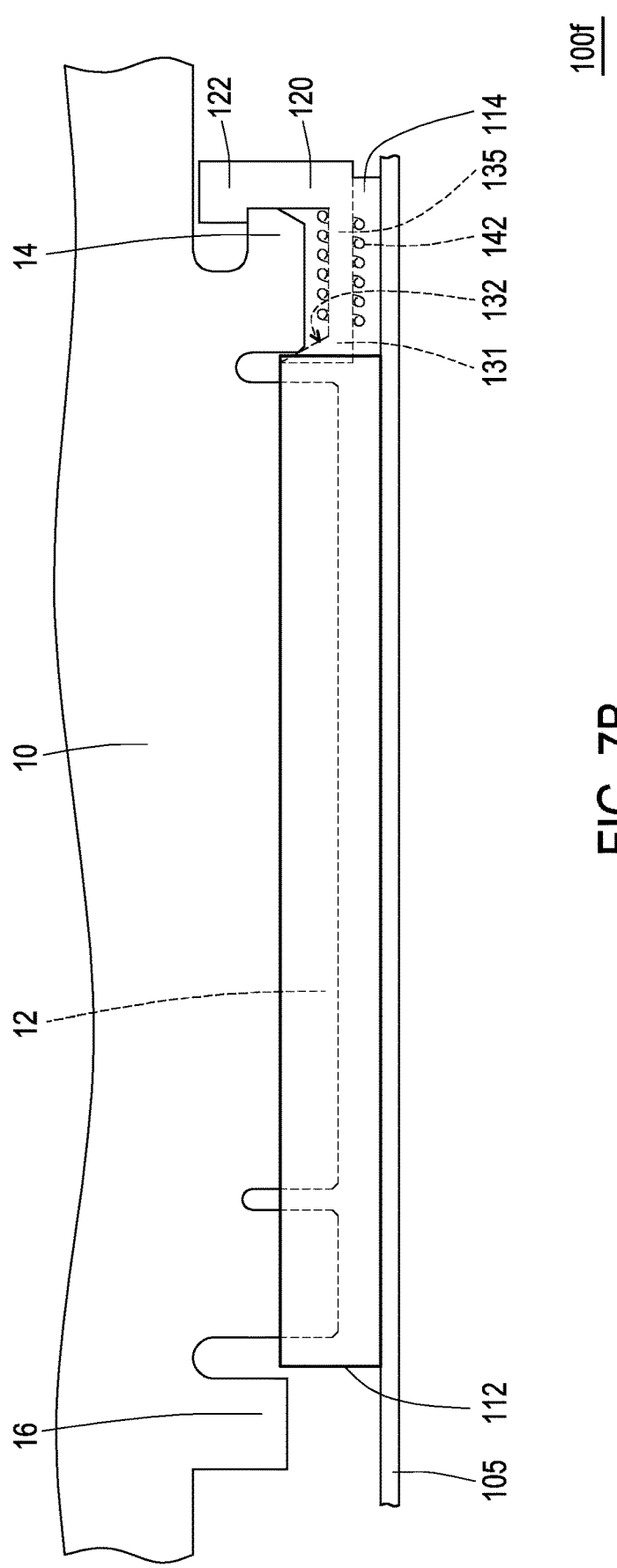

FIG. 7A to FIG. 7B are schematic views of a process of inserting an expansion card into a circuit board according to another embodiment of the disclosure. Please refer to FIG. 7A to FIG. 7B. In a circuit board 100f of this embodiment, the driving member 131, the linking member 135, and the release structure 120 are integrated. The linking member 135 and the release structure 120 are disposed at the connecting end 114. The first elastic member 140 is disposed between the connecting end 114 and the release structure 120.

As shown in FIG. 7B, when the electrical contact part 12 of the expansion card 10 is inserted into the socket 112, the positioning part 14 of the expansion card 10 presses down the first bevel 132 of the driving member 131 to drive the linking member 135 and the release structure 120 to move (to the left) toward the socket 112, so that the limiting part 122 of the release structure 120 is limiting to the positioning part 14 of the expansion card 10. The first elastic member 140 accumulates an elastic force.

When the expansion card 10 is subjected to an upward force so that the electrical contact part 12 of the expansion card 10 is removed from the socket 112, since the driving member 131 is no longer pressed by the positioning part 14, the first elastic member 140 releases the elastic force to push the release structure 120 to move to the right. Limiting from the limiting part 122 of the release structure 120 to the positioning part 14 of the expansion card 10 is then released, thereby causing the driving member 131 to return upward to a position as in FIG. 7A.

In summary, in the circuit board of the disclosure, when the electrical contact part of the expansion card is inserted into the socket on the card slot, the electrical contact part, the non-electrical convex part, or the positioning part presses the driving member, the driving member drives the linking member to move, thereby driving the release structure to move, so that the limiting part of the release structure is limiting to the positioning part of the expansion card, thereby providing various actuation modes to the release structure. In addition, when the electrical contact part of the expansion card is removed from the socket on the card slot, the driving member, the linking member, and the release structure may automatically return, and the buckling of the release structure to the positioning part of the expansion card is released. Therefore, the user does not need to press the release structure or other mechanisms linked to the release structure, and the operation is convenient.

What is claimed is:

1. A circuit board, adapted for inserting an expansion card, wherein the expansion card comprises an electrical contact part, a non-electrical convex part, and a positioning part, and the circuit board comprising:
   a board body;
   a slot, disposed on the board body, comprising:
      a socket, adapted for the electrical contact part to be inserted;
      a connecting end, adjacent to the socket; and
      an outer surface, adjacent to the socket and away from the connecting end;
   a release structure, movably disposed at the connecting end and comprising a limiting part; and
   a transmission mechanism, disposed in the socket, adjacent to the connecting end, or adjacent to the outer surface, comprising:
      a driving member, adapted for contacting the electrical contact part, the non-electrical convex part, or the positioning part; and
      a linking member, disposed between the driving member and the release structure, wherein the driving member is linked to the linking member, and the linking member is linked to the release structure, wherein
   when the electrical contact part is inserted into the socket, the electrical contact part, the non-electrical convex part, or the positioning part presses the driving member, the driving member drives the linking member to move, thereby driving the release structure to move, so that the limiting part is limiting to the positioning part, wherein the release structure is movably disposed at the connecting end, the linking member and the release structure are integrated, when the electrical contact part is inserted into the socket, the expansion card presses the driving member to drive the release structure to move toward the socket, so that the limiting part limits the positioning part.

2. The circuit board according to claim 1, wherein the release structure further comprises a pivot and a first pushing part, the pivot is disposed between the first pushing part and the limiting part, the pivot is pivotally connected to the connecting end, and the linking member comprises a second pushing part abutting the first pushing part, when the electrical contact part is inserted into the socket, the electrical contact part, the non-electrical convex part, or the positioning part presses the driving member, so that the second pushing part of the linking member pushes the first pushing part, the release structure rotates correspondingly, and the limiting part is limiting to the positioning part.

3. The circuit board according to claim 2, wherein the driving member comprises a first bevel, and the linking member comprises a second bevel abutting the first bevel, when the electrical contact part, the non-electrical convex part, or the positioning part presses the driving member, the first bevel of the driving member pushes the second bevel to drive the linking member.

4. The circuit board according to claim 2, further comprising a first elastic member disposed between the connecting end and the release structure, when the limiting part is limiting to the positioning part, the first elastic member accumulates an elastic force, when the electrical contact part is removed from the socket, the first elastic member releases the elastic force to push the release structure to rotate, limiting from the limiting part to the positioning part is released, and the first pushing part pushes the second pushing part, thereby causing the driving member to return.

5. The circuit board according to claim 1, further comprising a second elastic member sleeved on the linking member and disposed between the release structure and the driving member.

6. The circuit board according to claim 5, further comprising a fixing base disposed between the connecting end and the board body, and the second elastic member is disposed between the connecting end and the fixing base.

7. The circuit board according to claim 1, wherein the driving member is disposed in the socket, and the driving member is adapted for being pressed down by the electrical contact part of the expansion card to move.

8. The circuit board according to claim 1, wherein the driving member is disposed beside the outer surface and exposed to the card slot, and the driving member is adapted for being pressed down by the non-electrical convex part of the expansion card to move.

9. The circuit board according to claim 2, wherein the driving member and the linking member are integrated.

10. The circuit board according to claim 1, further comprising a first elastic member and a second elastic member, wherein the first elastic member is disposed below the driving member, the second elastic member is pre-stretched and disposed between the release structure and the connecting end, and an elastic coefficient of the first elastic member is greater than an elastic coefficient of the second elastic member.

11. The circuit board according to claim 10, wherein the driving member comprises a first bevel, the linking member comprises a second bevel, when the electrical contact part is not inserted into the socket, the first bevel abuts the second bevel, and the second elastic member is pre-stretched to accumulate an elastic force, when the electrical contact part is inserted into the socket, the expansion card presses the driving member, the first elastic member accumulates an elastic force, the first bevel of the driving member moves away from the second bevel, and the second elastic member releases the elastic force to drive the release structure to move toward the socket, so that the limiting part is limiting to the positioning part, and the first bevel again abuts the second bevel.

12. The circuit board according to claim 11, wherein when the electrical contact part is removed from the socket, the first elastic member releases the elastic force to push the driving member upward to return, the first bevel pushes the second bevel, the release structure moves in a direction away from the socket, and limiting from the limiting part to the positioning part is released.

13. The circuit board according to claim 1, wherein the driving member comprises a first bevel, the linking member comprises a second bevel, and when the expansion card presses the driving member, the first bevel pushes the second bevel.

14. The circuit board according to claim 1, wherein the driving member, the linking member, and the release structure are integrated.

15. The circuit board according to claim 1, wherein the driving member is disposed in the connecting end, and the driving member is adapted for being pressed down by the positioning part of the expansion card to move.

16. The circuit board according to claim 1, further comprising a first elastic member disposed between the connecting end and the release structure.

* * * * *